United States Patent [19]
Laube et al.

[11] Patent Number: 5,535,128
[45] Date of Patent: Jul. 9, 1996

[54] HIERARCHICAL FEEDBACK CONTROL OF PULSED LASER DEPOSITION

[75] Inventors: Samuel J. P. Laube, Cincinnati; Elizabeth F. Stark, Dayton, both of Ohio

[73] Assignee: The United States of America as represented by the Secretary of the Air Force, Washington, D.C.

[21] Appl. No.: 386,368

[22] Filed: Feb. 9, 1995

[51] Int. Cl.$^6$ .................................................. G06F 17/00
[52] U.S. Cl. .................. 364/468.26; 364/148; 364/150; 505/474; 427/596
[58] Field of Search ................................. 364/148–152, 364/160–165, 468; 505/325, 701, 473, 474, 480, 730, 732; 427/595, 596, 597, 62, 63, 126.3

[56] References Cited

U.S. PATENT DOCUMENTS

| | | | |
|---|---|---|---|
| 5,290,761 | 3/1994 | Keating et al. | 505/474 |
| 5,405,659 | 4/1995 | Fernandez | 427/596 |

OTHER PUBLICATIONS

S. J. P. Laube and E. F. Stark, "Feedback Control of Pulsed Laser Deposition Process", *AIP Conf. Proceedings 288, Laser Ablation: Mechanisms and Applications–II*, Second International Conference, Knoxville, TN, Apr. 1993. pp. 242–247.

E. F. Stark and S. J. Laube, "Self Directed Control of Pulsed Laser Deposition", *ASM Journal of Materials Engineering and Performance*, vol. 2, No. 5, Oct., 1993, pp. 721–725 [cited as JMEPEG (1993)2:721–726], ASM International®, Materials Park, OH 44073-0002.

S. J. P. Laube and E. F. Stark, "Artificial Intelligence in Process Control of Pulsed Laser Deposition", *AIRTC'94 Symposium on Artificial Intelligence in Real Time Control* (Preprints), Valencia, 3–5 Oct. 1994.

J. Cheung, J. Horowitz, "Pulsed Laser Deposition History and Laser–Target Interactions" *MRS Bulletin*, vol. 17, No. 2 (Feb. 1992), pp. 30–36.

R. K. Singh and J. Narayan, "Pulsed–Laser Evaporation Technique for Deposition of Thin Films: Physics and Theorectical Model", *Physical Review B, The American Physical Society*, vol. 41, No. 13, May 1990.

(List continued on next page.)

*Primary Examiner*—Roy N. Envall, Jr.
*Assistant Examiner*—Thomas E. Brown
*Attorney, Agent, or Firm*—Bernard E. Franz; Thomas L. Kundert

[57] ABSTRACT

A hierarchical control PLD system controls deposition processes by feedback means, for industrial production of tribological thin films. PLD process system identification, intelligent feedback control architecture, and implementation for ultraviolet pulsed laser deposition processes are provided. This system has three levels of feedback control. The first level of feedback control improves the precision and tracking of sub process variables by linear observer based compensator control. The Mo I plume species density per laser pulse and bulk substrate thickness by the quartz crystal micro balance provide real time sub process data to the observer. The observer based compensator then directly calculates laser energy density per pulse and pulse repetition rate based on the current values predicted by the linear model. The second level consists of a dynamical system design algorithm and nonlinear process map. The nonlinear mapping is used to design a new observer based compensator for each linearization point chosen by the third level of control. The third level features an expert system rulebase and command inputs to achieve a desired product goal. The expert controller decides whether or not the process linearized model used by the first level of control is accurate enough to achieve the desired process goals. Based on controller-process performance, a controller re-design is commanded by the third level to the second level, and then implemented by the first level.

2 Claims, 13 Drawing Sheets

OTHER PUBLICATIONS

P. S. P. Wei, R. B. Hall, and W. E. Maher, "Study of Laser–Supported detonation Waves by Time–Resolved Spectroscopy", *The Journal of Chemical Physics,* vol. 59, No. 7, 1 Oct. 1973, pp. 3692–3700.

D. B. Goehegan, "Physics and Diagnostics of Laser Ablation Plume Propagation for High–$T_c$ Superconductor Film Growth", Solid State Division, Oak Ridge National Laboratory, P.O. Box 2008, Oak Ridge, TN 37831–6056, submitted for the International Conference on Metallurgical Coatings and Thin Films, ICMCTF–92, San Diego, CA, Apr. 6–10, 1992.

D. B. Geohegan, "Effects of Ambient Background Gases on YBCO Plume Propagation Under Film Growth Conditions: Spectroscopic, Ion Probe, and Fast Photographic Studies", Solid State Division, Oak Ridge National Laboratory, P.O. Box 2008, Oak Ridge, TN 37831–6056, submitted for the E–MRS *Summer School on Laser Ablation of Electronic Materials: Basic Mechanisms and Applications,* Carcans–Maubuisson, France, Sep., 1991.

D. B. Chrisey and A. Inam, "Pulsed Laser Deposition of High $T_c$ Superconducting Thin Films for Electronic Device Applications", MRS Bulletin, Feb. 1992.

S. R. Foltyn, R. E. Muenchausen, R. C. Estler, E. Peterson, W. B. Hutchinson, K. C. Ott, N. S. Hubbard, R. C. Dye, X. D. Wu, "Influence of Beam and Target Properties on the Excimer Laser Deposition of $YBa_2Cu_3O_{7-x}$ Thin Films", Los Alamos National Laboratory, Los Alamos, NM 87545, *Materials Research Society Symp. Proc.* vol. 191, 1990, pp. 205–209.

N. H. Cheung Q. Y. Ying, J. P. Zheng, and H. S. Kwok, "Time–Resolved Resonant Absorption Study of 532–nm Laser–Generated Plumes Over $YBa_2Cu_3O_7$ Targets", *J. Appl. Phys.* 69(9), 1 May 1991, American Institute of Physics, pp. 6349–6354.

T. Venkatesan, X. D. Wu, A. Inam, and J. B. Wachtman, "Observation of Two Distinct Components During Pulsed Laser Deposition of High $T_c$ Superconductor Films", *Appl. Phys. Lett* 52 (14), 4 Apr. 1988, American Institute of Physics, pp. 1193–1195.

A. Gupta, B. Braren, K. G. Casey, B. W. Hussey, and R. Kelly, "Direct Imaging of the Fragments Produced During Excimer Laser Ablation of $YBa_2Cu_3O_{7-\delta}$", 1991.

G. Koren, A. Gupta, R. J. Baseman, M. I. Lutwyche, and R. B. Laibowitz, "Laser Wavelength Dependent Properties of $YBa_2Cu_3O_{7-\delta}$ Thin Films Deposited by Laser Ablation", *Appl. Phys. Lett* 55 (23), 4 Dec. 1989, American Institute of Physics, pp. 2450–2452.

A. Inam, and X. D. Wu, "Pulsed Laser Etching of High $T_c$ Superconductor Films", *Appl. Phys. Lett* 51 (14), 5 Oct. 1987, American Institute of Physics, pp. 1112–1114.

E. G. Scott, S. T. Davey, M. A. G. Halliwell, and G. J. Davies, "Improvements to and Characterization of GaInAs Heterointerfaces Grown by Molecular–Beam Epitaxy", J. VAc.Sci. technol. B 6, Mar/Apr 1988, American Vacuum Society, pp. 603–605.

C. E. Otis, and R. W. Dreyfus, "Laser Ablation of $YBa_2Cu_3O_{7-\delta}$ as Probed by Laser–Induced Fluorescence Spectroscopy", *Physical Review Letters,* 7 Oct. 1991, The American Physical Society, pp. 2102–2105.

T. Spalvins, "Lubrication with Sputtered $MoS_2$ Films: Principles, Operation, and Limitations", *ASM Journal of Materials Engineering and Performance,* vol. 1, No. 3, Jun., 1992, pp. 347–351 [cited as JMEPEG (1992)1:347–352], ASM International®.

P. T. Murray, V. J. Dyhouse, L. Grazulis, and D. R. Thomas, "Dynamics of $MoS_2$ Photoablation", Mat. Res. Symp. Proc. vol. 201, 1991, Materials research Society, pp. 513–518.

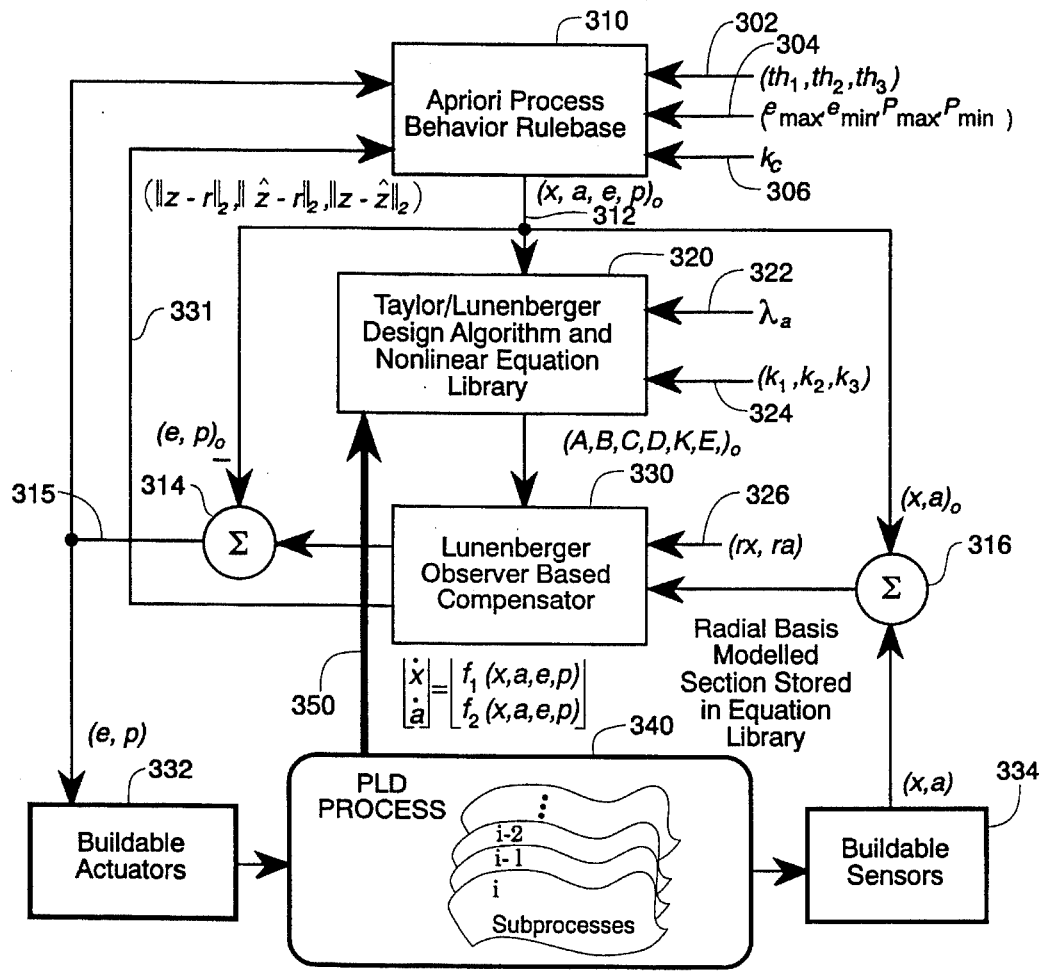

Fig. 3

| PARAMETER | MANUAL DEPOSITION | CLOSED LOOP DEPOSITION |
|---|---|---|
| Chemical Composition | S(2p)     163.3 eV<br>Mo(3d) 3/2  228.8 eV<br>Mo(3d) 5/2  232.0 eV | 162.1 eV -> -1.2 shift<br>228.5 eV -> -0.3 shift<br>231.6 eV -> -0.4 shift |
| Film Growth | Sixty minutes per 1000Å film. | Six minutes per 1000Å film. |
| Film Morphology | Amorphous hillox covered. | Amorphous hillox covered. |
| Process Utilization | Target life -> One film per day. | Target life -> Two film per day. |
| Operator Requirement | Two Ph.D.'s | One technician. |

Fig. 3a

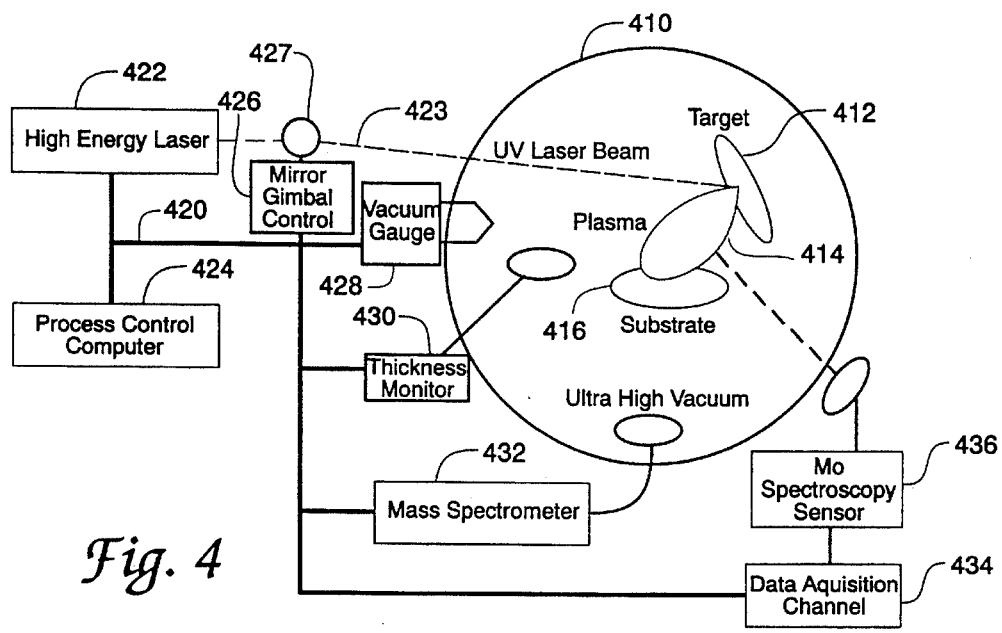
*Fig. 4*
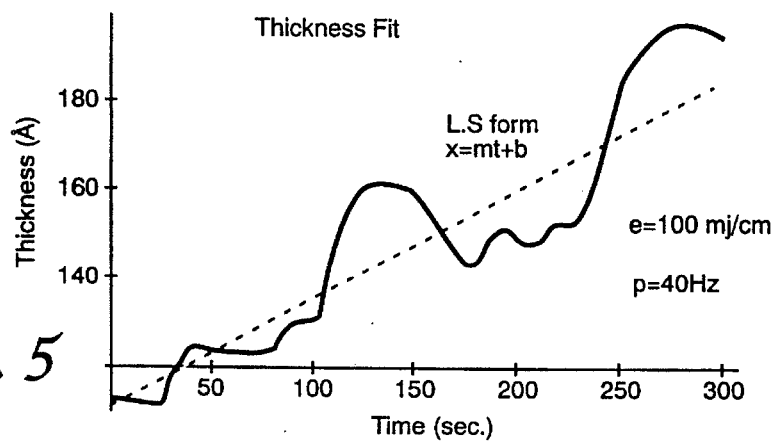
*Fig. 5*
$$\dot{a} = 0.00035\, e^{\left(-12.5(0.213+a)^2 - \frac{1}{1800}(-170+e)^2 - \frac{1}{5000}(-100+p)^2 - 2(-1.12+x)^2\right)}$$
$$+ 0.00002\, e^{\left(-12.5(0.091+a)^2 - \frac{1}{1800}(-170+e)^2 - \frac{1}{5000}(-40+p)^2 - 2(-0.195+x)^2\right)}$$
$$+ 0.00073\, e^{\left(-12.5(0.707+a)^2 - \frac{1}{1800}(-200+e)^2 - \frac{1}{5000}(-100+p)^2 - 2(-0.0059+x)^2\right)}$$
*Fig. 5a*
$$\dot{x} = 0.00114\, e^{\left(-12.5(0.214+a)^2 - \frac{1}{1800}(-170+e)^2 - \frac{1}{5000}(-100+p)^2 - 2(-1.12+x)^2\right)}$$
$$+ 0.00005\, e^{\left(-12.5(0.091+a)^2 - \frac{1}{1800}(-170+e)^2 - \frac{1}{5000}(-40+p)^2 - 2(-0.195+x)^2\right)}$$
$$+ 0.00292\, e^{\left(-12.5(0.707+a)^2 - \frac{1}{1800}(-200+e)^2 - \frac{1}{5000}(-100+p)^2 - 2(-0.0059+x)^2\right)}$$
*Fig. 5b*

------ Process
——— Observer
······· Setpoint

Action is taken only if all events are true for k times

HIERARCHICAL FEEDBACK CONTROL OF PULSED LASER DEPOSITION

RIGHTS OF THE GOVERNMENT

The invention described herein may be manufactured and used by or for the Government of the United States for all governmental purposes without the payment of any royalty.

RELATED APPLICATION

This application is related to an application by the same applicants titled "Automation of Pulsed Laser Deposition", Ser. No. 08/836,240, filed on the same day, and hereby incorporated by reference.

BACKGROUND OF THE INVENTION

The present invention relates generally to hierarchical feedback control of pulsed laser deposition (PLD).

PLD is a new deposition method that utilizes high energy pulses of laser light in a vacuum to liberate material for deposition onto a surface. Many new thin films are complex in chemical and physical composition. PLD is a means in which complex molecular structures can be deposited on surfaces. PLD is unique in that high energies are used to motivate the material that is deposited. One of the difficulties with PLD is that the interaction of laser light pulses and material is poorly understood, when laser light in the UV spectrum is used. Unfortunately, UV laser light also is higher in energy, thus capable of providing higher deposition energy. Materials deposited by PLD range from tribological materials to superconductors. PLD also has application as an analysis tool, such as electrophoresis. Unfortunately, PLD has yet to be utilized as an industrial deposition process, due to implementation complexities and uncertainty of theoretical understanding. Overcoming these barriers by feedback control enables PLD to produce superior materials. Development of a control design methodology specific to PLD is necessary so reduced uncertainty can be realized, ultimately improving thin film quality.

The following technical paper publications are of interest with respect to the present invention.

S. J. P. Laube and E. F. Stark, "Feedback Control of Pulsed Laser Deposition Processes", *AIP Conf. Proceedings 288, Laser Ablation: Mechanisms and Applications-II*, Second International Conference, Knoxville, Tenn., April 1993. pp.242–247.

E. F. Stark and S. J. P. Laube, "Self Directed Control of Pulsed Laser Deposition", *ASM Journal of Materials Engineering and Performance*, Vol. 2, No. 5, October, 1993, pp.721–725 [cited as JMEPEG (1993)2:721–726], ASM International®, Matertials Park, Ohio 44073-0002.

S. J. P. Laube and E. F. Stark, "Artificial Intelligence in Process Control of Pulsed Laser Deposition", *AIRTC'94 Symposium on Artificial Intelligence in Real Time Control* (Preprints), Valencia, 3–5 October 1994.

The above three papers authored by applicants are closely related to the invention.

Other papers of interest include:

J. Cheung, J. Horowitz, "Pulsed Laser Deposition History and Laser-Target Interactions" *MRS Bulletin*, vol. 17, No. 2 (February 1992), pp 30–36.

R. K. Singh and J. Narayan, "Pulsed-Laser Evaporation Technique for Deposition of Thin Films: Physics and Theoretical Model", *Physical Review B, The American Physical Society*, Vol. 41, No. 13, May 1990.

P. S. P. Wei, R. B. Hall, and W. E. Maher, "Study of Laser-Supported detonation Waves by Time-Resolved Spectroscopy", *The Journal of Chemical Physics*, Vol. 59, No. 7, 1 October 1973, pp. 3692–3700.

D. B. Geohegan, "Physics and Diagnostics of Laser Ablation Plume Propagation for High-$T_c$ Superconductor Film Growth", Solid State Division, Oak Ridge National Laboratory, P.O. Box 2008, Oak Ridge, Tenn. 37831-6056, submitted for the International Conference on Metallurgical Coatings and Thin Films, ICMCTF-92, San Diego, Calif., Apr. 6–10, 1992.

D. B. Geohegan, "Effects of Ambient Background Gases on YBCO Plume Propagation Under Film Growth Conditions: Spectroscopic, Ion Probe, and Fast Photographic Studies", Solid State Division, Oak Ridge National Laboratory, P.O. Box 2008, Oak Ridge, Tenn. 37831-6056, submitted for the E-MRS *Summer School on Laser Ablation of Electronic Materials: Basic Mechanisms and Applications*, Carcans-Maubuisson, France, September, 1991.

D. B. Chrisey and A. Inam, "Pulsed Laser Deposition of High $T_c$ Superconducting Thin Films for Electronic Device Applications", MRS Bulletin, February 1992.

S. R. Foltyn, R. E. Muenchausen, R. C. Estler, E. Peterson, W. B. Hutchinson, K. C. Ott, N. S. Hubbard, R. C. Dye, X. D. Wu, "Influence of Beam and Target Properties on the Excimer Laser Deposition of $YBa_2Cu_3O_{7-x}$ Thin Films", Los Alamos National Laboratory, Los Alamos, N. Mex. 87545, *Materials Research Society Symp. Proc.* Vol. 191, 1990, pp 205–209.

N. H. Cheung, Q. Y. Ying, J. P. Zheng, and H. S. Kwok, "Time-Resolved Resonant Absorbtion Study of 532-nm Laser-Generated Plumes Over $YBa_2Cu_3O_7$ Targets", *J. Appl. Phys.* 69(9), 1 May 1991, American Institute of Physics, pp. 6349–6354.

T. Venkatesan, X. D. Wu, A. Inam, and J. B. Wachtman, "Observation of Two Distinct Components During Pulsed Laser Deposition of High $T_c$ Superconductor Films", *Appl. Phys. Lett* 52 (14), 4 April 1988, American Institute of Physics, pp 1193–1195.

A. Gupta, B. Braren, K. G. Casey, B. W. Hussey, and R. Kelly, "Direct Imaging of the Fragments Produced During Excimer Laser Ablation of $YBa_2Cu_3O_{7-\delta}$", 1991.

G. Koren, A. Gupta, R. J. Baseman, M. I. Lutwyche, and R. B. Laibowitz, "Laser Wavelength Dependent Properties of $YBa_2Cu_3O_{7-\delta}$ Thin Films Deposited by Laser Ablation", *Appl. Phys. Lett* 55 (23), 4 Dec. 1989, American Institute of Physics, pp 2450–2452.

A. Inam, and X. D. Wu, "Pulsed Laser Etching of High $T_c$ Superconductor Films", *Appl. Phys. Lett* 51 (14), 5 Oct. 1987, American Institute of Physics, pp 1112–1114.

E. G. Scott, S. T. Davey, M. A. G. Halliwell, and G. J. Davies, "Improvements to and Characterization of GaInAs Heterointerfaces Grown by Molecular-Beam Epitaxy", J. VAc.Sci. technol. B 6, March/April 1988, American Vacuum Society, pp. 603–605.

C. E. Otis, and R. W. Dreyfus, "Laser Ablation of $YBa_2Cu_3O_{7-\delta}$ as Probed by Laer-Induced Fluorescence Spectroscopy", *Physical Review Letters*, 7 Oct. 1991, The American Physical Society, pp. 2102–2105.

T. Spalvins, "Lubrication with Sputtered $MoS_2$ Films: Principles, Operation, and Limitations", *ASM Journal of*

*Materials Engineering and Performance*, Vol. 1, No. 3, Jun., 1992, pp. 347–351 [cited as JMEPEG (1992)1:347–352], ASM International®.

P. T. Murray, V. J. Dyhouse, L. Grazulis, and D. R. Thomas, "Dynamics of $MoS_2$ Photoablation", Mat. Res. Symp. Proc. Vol. 201, 1991, Materials research Society, pp. 513–518.

SUMMARY OF THE INVENTION

An objective of the invention is to provide a system to control deposition processes by feedback means.

A further objective is to provide a process control design and implementation methodology to make PLD predictable and reliable enough for industrial production of tribological thin films. Sensors and actuators are selected that affect material chemistry, and reduce deposition time. A hierarchical control scheme is designed so that process variability can be contained and stabilized in real time.

PLD process system identification, intelligent feedback control architecture, and implementation for ultraviolet pulsed laser deposition processes will be demonstrated. An implementation methodology of the proposed architecture is given, as well as development of specialized sensor techniques and post process analysis.

The invention relates to control of deposition processes by feedback means. The PLD deposition process is unique in that process understanding is still being developed. Decomposing the process into three sub processes and then performing feedback control on these sub processes provides a method of improving the quality of materials generated by PLD. The sub processes utilized for PLD are shown in FIG. 1. These three sub processes were suspected to determine the thin film material characteristics.

According to the invention, a multi-featured control system improves the manufacturing capability of the thin-film tribological growth process, Pulsed Laser Deposition (PLD). This system utilizes novel sensors chosen by the concept of sub process control, combined with a dynamical PLD process description to improve the repeatability and accuracy of the process, as well as reduce the manpower requirements to operate PLD. The use of dynamical feedback control of PLD has permitted the growth of a deposited film crystal structure that was previously unattainable using open-loop control techniques. The reduction of process disorder by the implementation of sensor feedback also improves the PLD deposition process environment so that more thorough scientific investigation can take place. This system has three levels of feedback control.

The first level of feedback control improves the precision and tracking of sub process variables by linear observer based compensator control. The Mo I plume species density per laser pulse and bulk substrate thickness by the quartz crystal micro balance provide real time sub process data to the observer. The observer based compensator then directly calculates laser energy density per pulse and pulse repetition rate based on the current values predicted by the linear model.

The second level of feedback control provides the observer with the linear controller design. The second level consists of a dynamical system design algorithm and non-linear process map. The nonlinear mapping is used to design a new observer based compensator for each linearization point chosen by the third level of control. The second level relies on a nonlinear first order multidimensional differential mapping of the process. This nonlinear dynamical model of the process is updated using automatic process identification experiments. Although the observer design is based on a linear model that is dependent on each particular linearization point, the unique pole placement method used is not dependent on linearization point. Thus, the closed loop combination of controller and process attempt to achieve the selected dynamics, irrespective of linearization point.

The third level features an expert system rulebase and command inputs to achieve a desired product goal. The rulebase is general enough to be the basis of an expert system that deals with the interaction of any controller and process. The expert controller decides whether or not the process linearized model used by the first level of control is accurate enough to achieve the desired process goals. Based on controller-process performance, a controller re-design is commanded by the third level to the second level, and then implemented by the first level.

The interconnection of these three levels is unique in that it provides a method of nonlinear control, while still able to limit the controller dynamics to some predetermined bounds. Thus, stability issues can be addressed more directly, with some proof of assurance being made available based on the fixed pole placement dynamic choices.

The invention relates to the system as a whole, because, although many of the components of this system can improve the process on their own, the system has been designed to efficiently integrate the contributions of the many components, including but not limited to, the spectroscope and algorithm.

Uses of the Invention

Government use of this invention is in conjunction with PLD laboratory systems used by the Air Force Wright Laboratory, Materials Directorate (MLBT) at Wright-Patterson Air Force Base, Ohio for deposition of tribological materials, and MLPO for superconductor depositions. The invention is currently used to improve research staff effectiveness by process uncertainty reduction and automaton. The savings in time and dollars will be quantified as testing and use continues. Additional use of the invention by the government is for application to other processes such as chemical vapor deposition (CVD) and molecular beam epitaxy (MBE).

Advantages and New Features—The invention provides a new method of generating material with the PLD process. By actuating the laser dynamically, it is now possible to create molecular structures in thicknesses never before achievable. The invention also makes possible the reduction of process subparameter uncertainty, thus reducing process overall complexity. Dynamical uncertainty reduction aids in researching the process behavior by reducing the number of system unknowns. The invention is also the first time PLD has been modeled as a dynamical process. The results provide experimental proof that PLD should be modeled as a dynamical system in the future.

Features include:

1. PLD computer controlled hierarchical feedback control software.

2. Real time automatic PLD process parameter feedback control.

3. PLD superior material obtained by process feedback control.

BRIEF DESCRIPTION OF THE DRAWING

FIG. 3 is a diagram showing a PLD hierarchical controller implementation;

FIG. 3a is a table showing controller benefits;

FIG. 4 is a diagram showing a system feedback implementation;

FIG. 5 is a graph showing a rate measurement method graphic;

FIG. 5a shows equations for a PLD 248 nm Mo I dynamical model example;

FIG. 5b shows equations for a PLD 248 nm thickness dynamical model example;

DETAILED DESCRIPTION

The invention is at least partially disclosed in the Doctoral Dissertation, "Hierarchical Control of Pulsed Laser Deposition Processes for Manufacture", by Samuel J. P. Laube, Univ. of Cincinnati, presented Feb. 15, 1994, and not yet indexed in the University Library or otherwise published. A copy of the Dissertation is enclosed as a part of the application as filed, and is hereby incorporated by reference.

Figure 1:
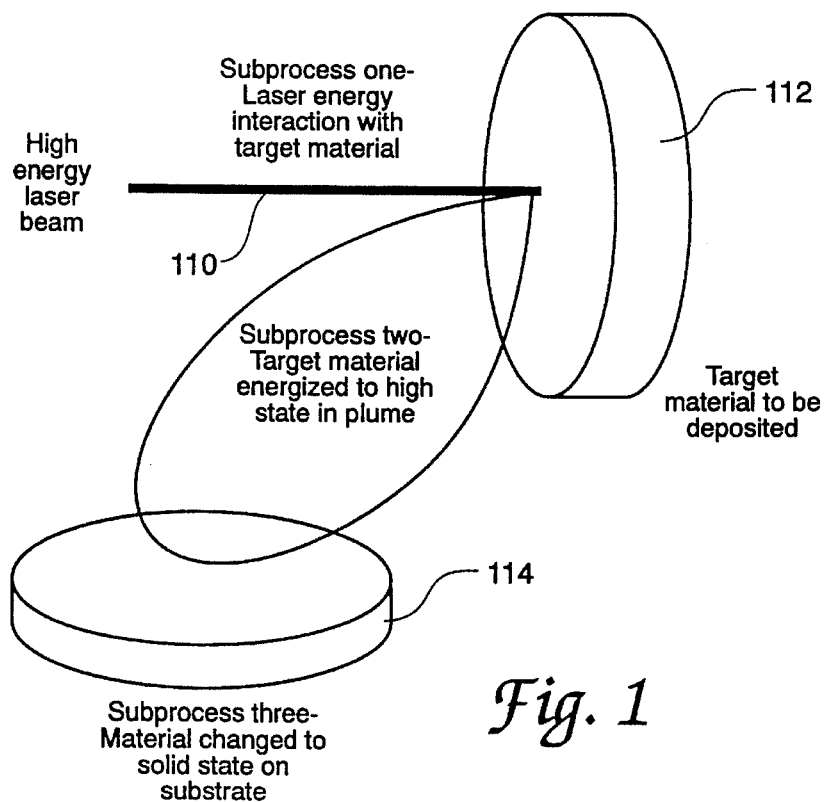
FIG. 1 is a diagram showing a PLD subprocess decomposition.

The purpose of this invention is to control deposition processes by feedback means. The PLD deposition process is unique in that process understanding is still being developed. Segregating the process into three sub processes and then performing feedback control on these sub processes provides a method of improving the quality of materials generated by PLD. The sub processes utilized for PLD are shown in FIG. 1. For subprocess one, a high energy laser beam 110 provides a laser energy interaction with target material 112, which is the material to be deposited. For subprocess two, the target material is energized to a high state in a plume. For subprocess three, the material is changed to the solid state on substrate 114. These three sub processes are suspected to determine the thin film material characteristics.

Figure 2:
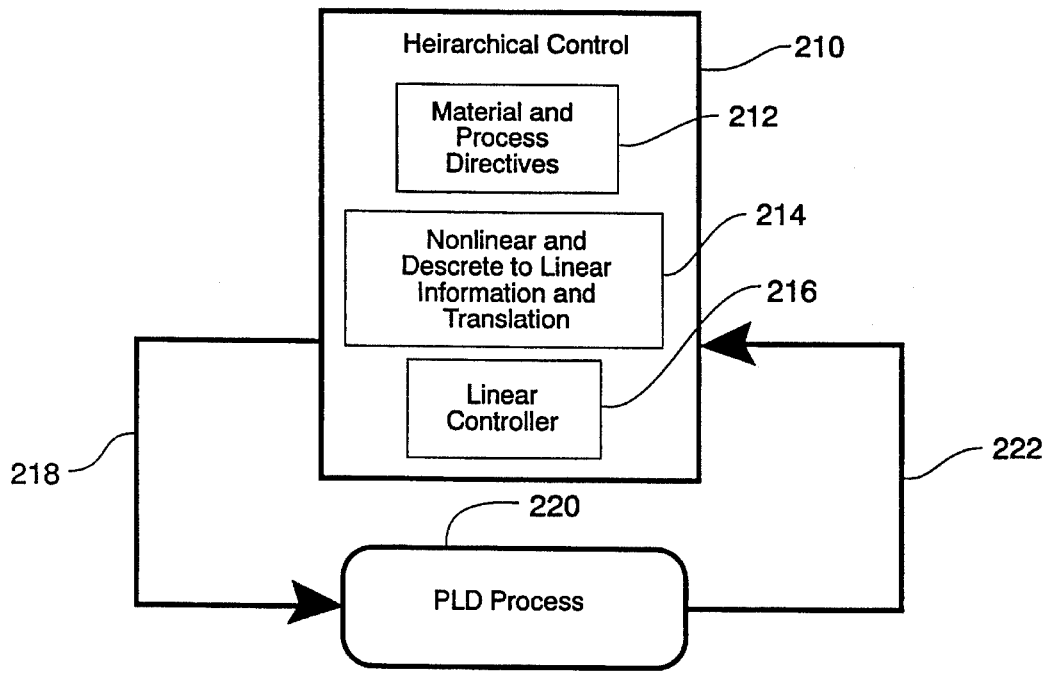
FIG. 2 is a diagram or flow chart showing a control hierarchy.

Once the sub processes are chosen, sensors and models are developed to form the basis of a control hierarchy, shown in FIG. 2. The hierarchical control represented by block 210 includes a material and process directives block 212, a nonlinear and discrete to linear information and translation block 214, and a linear control block 216. Output from the hierarchical control block 210 is supplied to the PLD process represented by block 220, and output from the PLD process block 220 is fed back to the Hierarchical control block 210. This hierarchy is developed with the material attributes in mind. An implementation of this hierarchy in an algorithmic form is shown in FIG. 3. A complete description of the inner workings of this hierarchy are contained in SECTION A, as well as a method of algorithmically implementing this design. This hierarchy utilizes three levels of control, described previously. The control hierarchy allows for capturing of both quantitative and qualitative information about the process.

The hierarchical controller implementation shown in FIG. 3 starts at block 310 with an a priori process behavior rulebase, with inputs 302, 304 and 306 of values as shown. Output from block 310 via line 312 goes to block 320, which provides a Taylor/Lunenberger design algorithm and non-linear equation library. Output from block 320 is supplied to a Lunen observer based compensator block 330. Block 330 also has an input 326 with values shown. One output from block 310 provides feedback to block 310. A summer 314 has inputs from blocks 310 and 330, and an output to block 310 and also to a block 332 for buildable actuators. The PLD process shown as block 340 has subprocesses i, i-1, i-2, etc., with input from the buildable actuators 332. A principal output from the PLD process 340 is via line 350 to the block 320, and another output is to buildable sensors block 334. A summer 316 has inputs from blocks 310 and 334, and output to block 330.

Implementation of this invention improves the PLD process by increasing the quantity and quality of produced thin films of $MoS_2$, as well as reducing the operator expertise. These improvements are shown as a table in FIG. 3a.

In order to implement feedback control, a process instrumentation and control suite, such as that shown in FIG. 4 is needed. This particular hardware configuration is also capable of implementing PLD process automation, as discussed in the "Automation of Pulsed Laser Deposition" patent application. The control can be incorporated into the automation scheme as a module.

The hardware module of FIG. 4 includes an ultra high vacuum chamber 410 in which are located the target 412 producing a plasma 414 to the substrate 416. An IEEE 488 data bus 420 interconnects a high energy laser 422, a process control computer 424, a mirror gimbal 427 and control 426, a vacuum gage 428, a thickness monitor 430, a mass spectrometer 432 and a data acquisition channel 434. The vacuum gage 428, the thickness monitor 430, the mass spectrometer 432 and a Mo spectroscopy sensor 436 all have sensors within the vacuum chamber 410. The Mo spectroscopy sensor 436 supplies data to the data acquisition channel 434.

The PLD control algorithm utilizes a dynamical description. This description is found by radial basis methods discussed in SECTION A below. Derivative measurements are made by linear regression methods. A typical derivative measurement is shown in FIG. 5 for the thickness sensor. Dynamical solution used in these particular experiments have the final forms shown in FIGS. 5a and 5b although other methods, such as neural nets, can be used to arrive at dynamical process representations.

Figure 6:
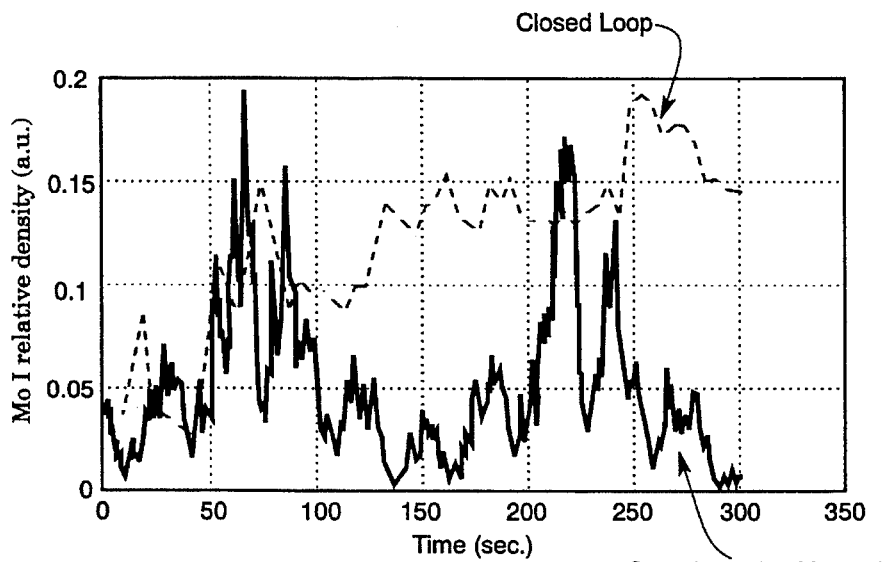
FIG. 6 is a graph showing a target raster variation reduction due to closed loop control.

Implementation of the invention results in sub process disorder reduction. This is shown in FIG. 6 for Mo I plume species during two depositions, one being open loop, and the other being closed loop. The reduction of disorder can be seen in that the distribution of data is reduced.

Figure 7:
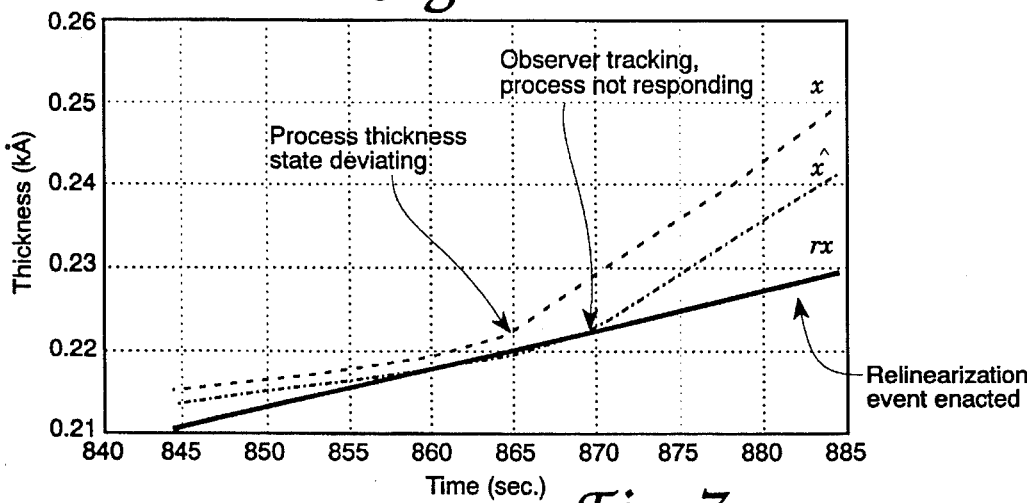
FIG. 7 is a graph showing a closed loop event of thickness state.

The occurrence of rulebase events is common during a PLD deposition. An occurrence of the controller redesign event is shown in FIG. 7. This graph of data shows how the controller attempted to achieve the desired setpoint value for thickness, but after approximately 20 seconds, the setpoint could not be achieved. This resulted in a relinearization event, after the consensus filter time expired.

Figure 8:
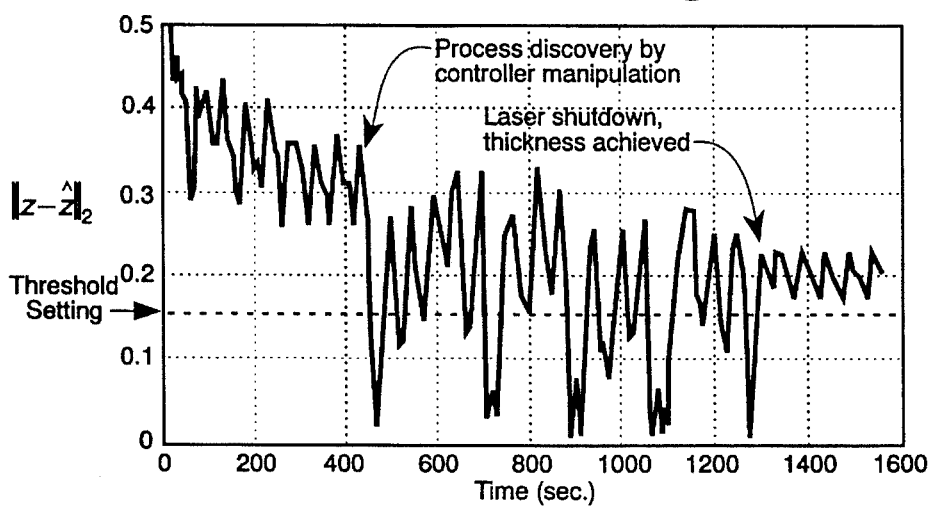
FIG. 8 is a graph showing observer process state error reduction.

The effect of the rulebase on a deposition run is that the controller and process are manipulated so that there is a better agreement between the two. This can be seen in FIG. 8, by the reduction of tracking error during a deposition.

As can be seen by these examples, the process controller accomplishes these purposes.

The invention relates to a multi-featured control system which improves the manufacturing capability of the thin-film tribological growth process, Pulsed Laser Deposition (PLD). This system utilizes novel sensors chosen by the concept of sub process control, combined with a dynamical PLD process description to improve the repeatability and accuracy of the process, as well as reduce the manpower requirements to operate PLD. The use of dynamical feedback control of PLD has permitted the growth of a deposited film crystal structure that was previously unattainable using open-loop control techniques. The reduction of process disorder by the implementation of sensor feedback also improves the PLD deposition process environment so that more thorough scientific investigation can take place. This system has three levels of feedback control.

The first level of feedback control improves the precision and tracking of sub process variables by linear observer based compensator control. The observer based compensator uses sensors in real time to calculate actuator values that directly affect the product.

The observer linear model is derived from a nonlinear process model by the second level of feedback. The Mo I plume species density per laser pulse and bulk substrate thickness by the quartz crystal micro balance provide real time sub process data to the observer. The observer based compensator then directly calculates laser energy density per pulse and pulse repetition rate based on the current values predicted by the linear model.

The second level of feedback control provides the observer with the linear controller design. The second level consists of a dynamical system design algorithm and nonlinear process map. The nonlinear mapping is used to design a new observer based compensator for each linearization point chosen by the third level of control.

The design algorithm modifies observer dynamics to better suit the interaction between process and linear observer, based on a particular linearization point. The observer design algorithm must yield a valid, stable observer compensator design for each chosen linearization point. If the design is not able to achieve the desired dynamics, the algorithm redesigns the controller, based on a slightly different linearization point. This new linearization point is chosen from data provided by the real time sensors.

As mentioned previously, the second level relies on a nonlinear first order multidimensional differential mapping of the process. This mapping currently relates laser energy density and pulse rate to Mo I density and bulk thickness, although any dimension and parameters can be used. This nonlinear dynamical model of the process is updated using automatic process identification experiments.

Closed loop observer dynamics are chosen by a unique method of pole placement. This unique method separates the closed loop controller dynamics from each linearization point choice. Although the observer design is based on a linear model that is dependent on each particular linearization point, the pole placement method is not dependent on linearization point. Thus, the closed loop combination of controller and process attempt to achieve the selected dynamics, irrespective of linearization point.

The third level features an expert system rulebase and command inputs to achieve a desired product goal. The third level is particularly useful during the development process for new materials. The rulebase is general enough to be the basis of an expert system that deals with the interaction of any controller and process. The expert controller decides whether or not the process linearized model used by the first level of control is accurate enough to achieve the desired process goals. If the linearized observer controller is not sufficient, the second level of control is capable of designing an new observer. Based on controller-process performance, a controller re-design is commanded by the third level to the second level, and then implemented by the first level.

The interconnection of these three levels is unique in that it provides a method of nonlinear control, while still able to limit the controller dynamics to some predetermined bounds. Thus, stability issues can be addressed more directly, with some proof of assurance being made available based on the fixed pole placement dynamic choices.

Discussion—Use of process feedback for pulsed laser deposition enables the creation of materials never achieved before. This is a significant step toward molecular process design. Implementation of this concept by utilization of process feedback and sub process decomposition concepts is unique.

Figure 9:
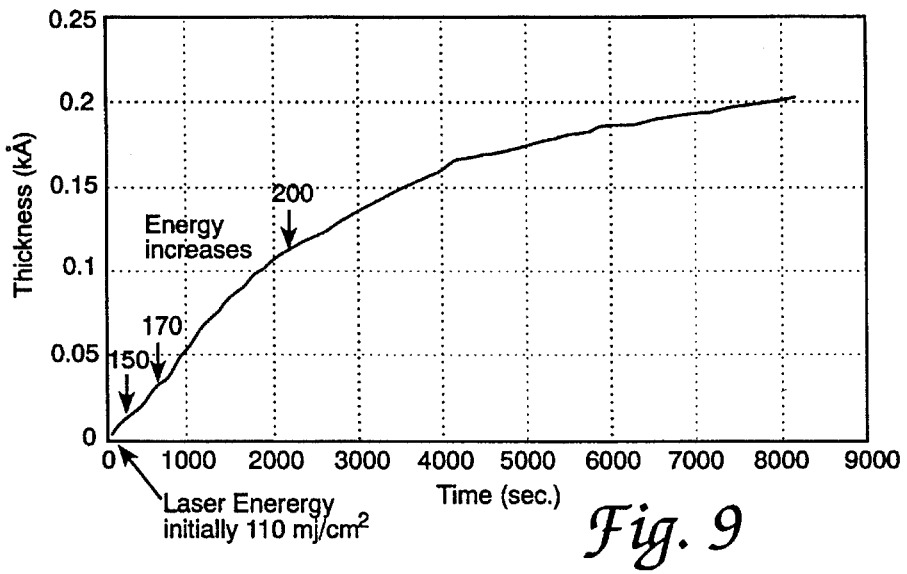
FIG. 9 is a graph showing open loop thickness at four energy densities.
Figure 10:
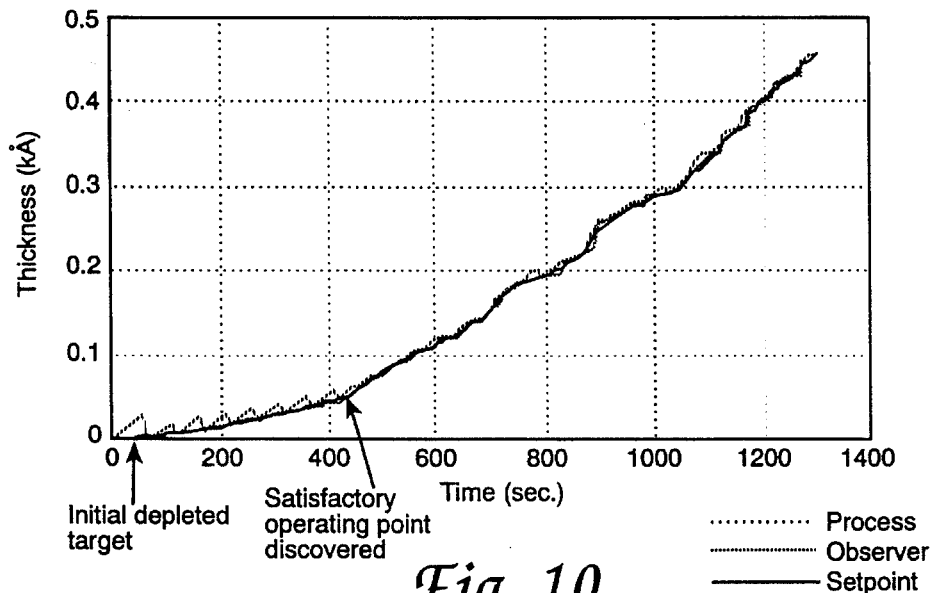
FIG. 10 is a graph showing closed loop thickness.
Figure 11:
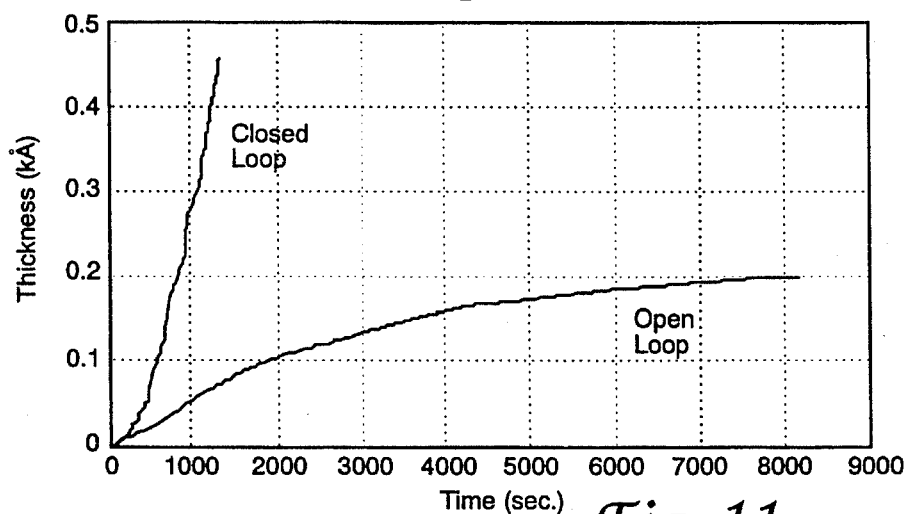
FIG. 11 is a graph showing open vs. closed loop thickness.

A comparison of open loop and closed loop deposition thickness data is shown in FIGS. 9 and 10. The open loop deposition thickness shown in FIG. 9 shows the effects of manual laser increases, such as what an operator might do during a deposition. As can be seen, the increases have little effect on deposition rate. Closed loop control was then implemented after this deposition had ceased. As can be seen in FIG. 10, the controller was able to manipulate the process in such a way that deposition rate is renewed. Plotting both thicknesses over time can be seen in FIG. 11. The increase in deposition rate is obvious.

Figure 12:
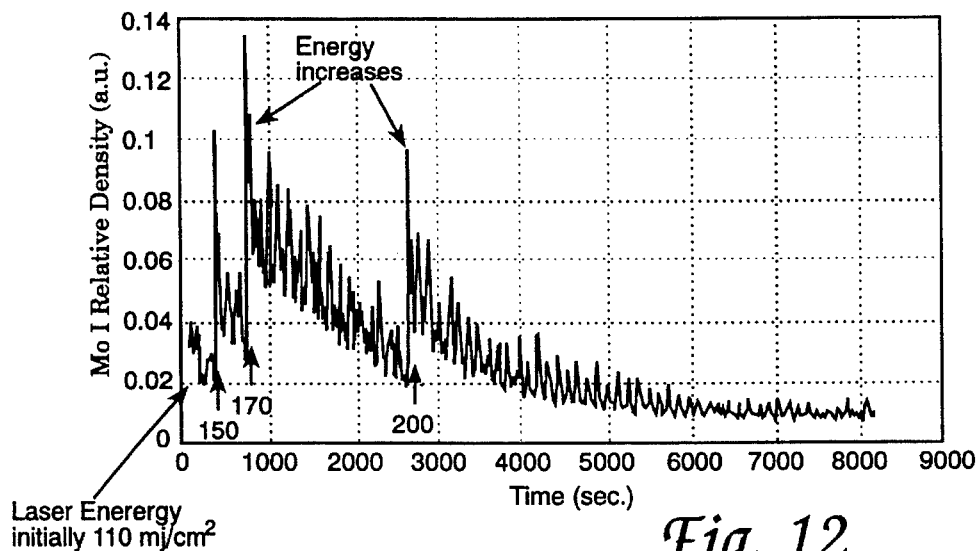
FIG. 12 is a graph showing open loop Mo I density at four energy densities.
Figure 13:
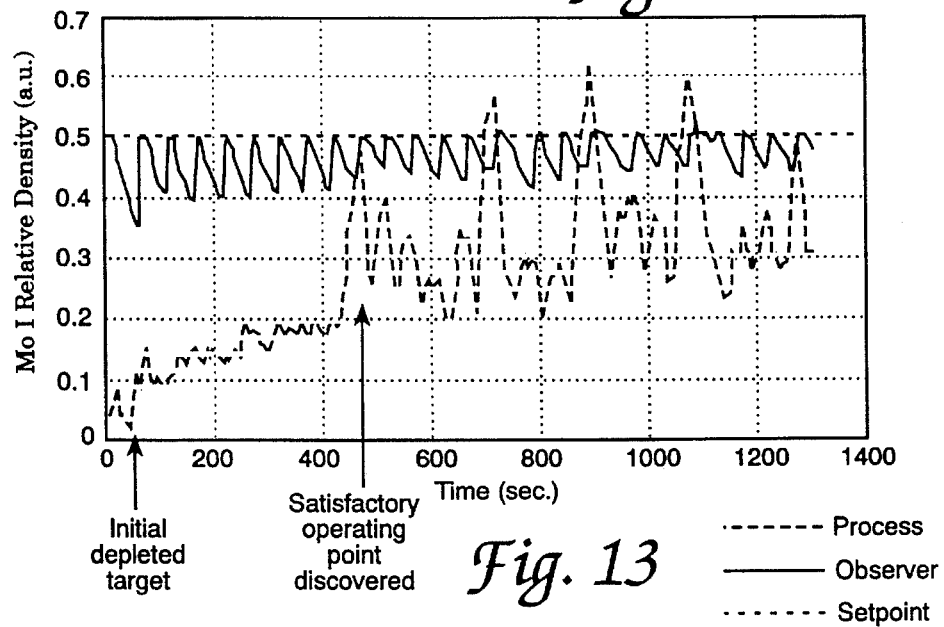
FIG. 13 is a graph showing closed loop Mo I density.
Figure 14:
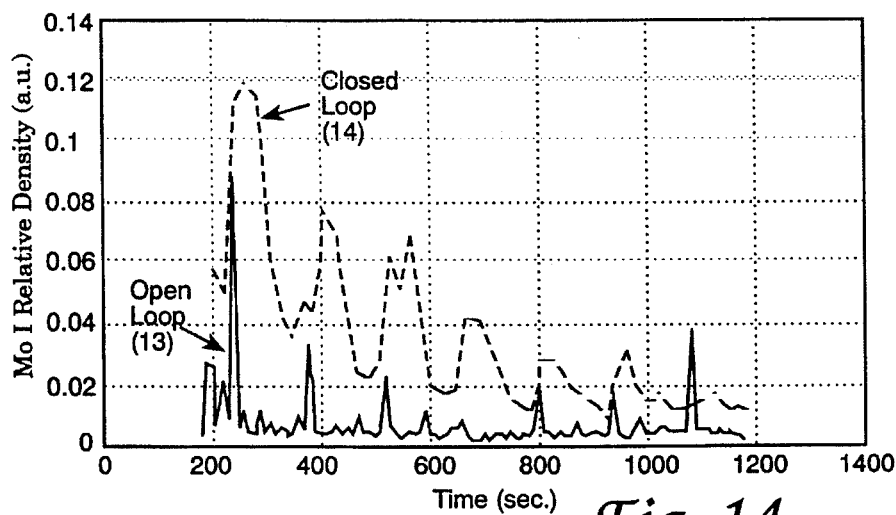
FIG. 14 is a graph showing open vs. closed loop Mo I spectroscopy.

Relative Mo I plume species density was also recorded simultaneously with the thickness data shown in FIG. 9. The Mo I species data is shown in FIG. 12. As can be seen, the manual increases by the operator are more evident, but still decrease after every manual increase of laser energy. Closed loop Mo I relative species density is shown in FIG. 13. As can be seen, the species density is initially low, but increases during the deposition, achieving setpoint values three times in this run. A comparison of open and closed loop Mo I plume species is also shown in FIG. 14, for an earlier run, with lower controller dynamics. Thus, we can see that closed loop dynamic choice affects plume constituent relative density.

Figure 15:
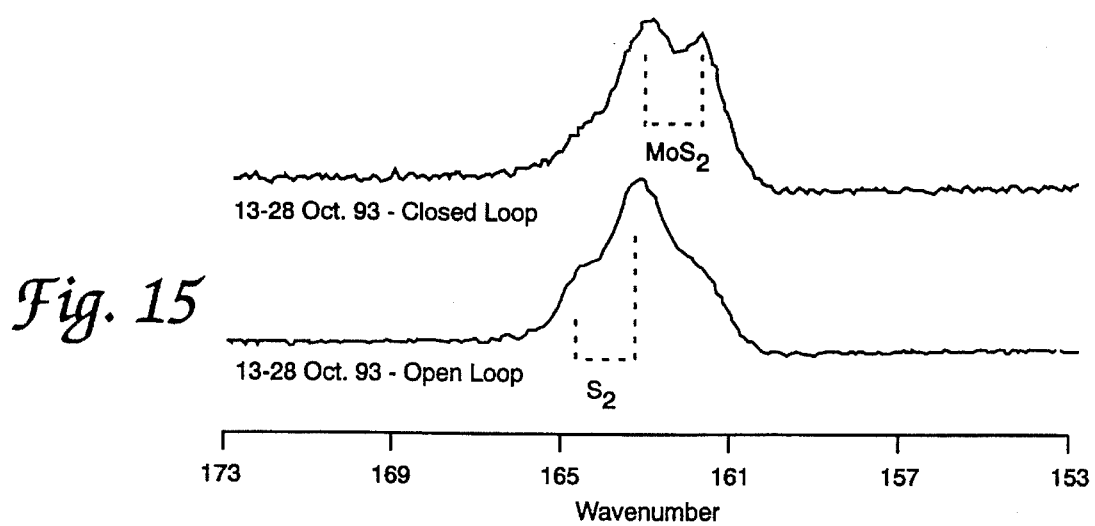
FIG. 15 is a graph showing XPS wavenumber $MoS_2$ sulfur 2p spectral response.
Figure 16:
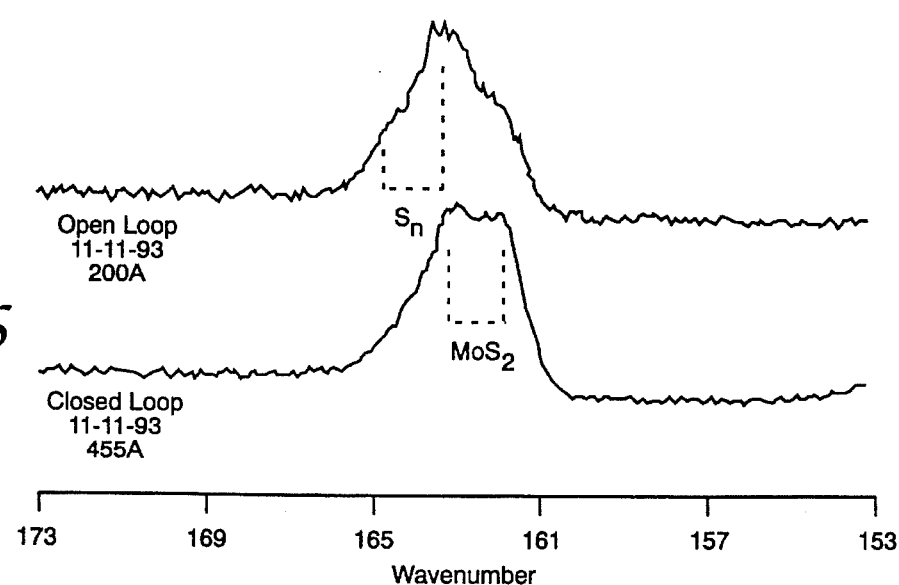
FIG. 16 is a graph showing S 2p XPS comparison of closed vs. open loop films.
Figure 17:
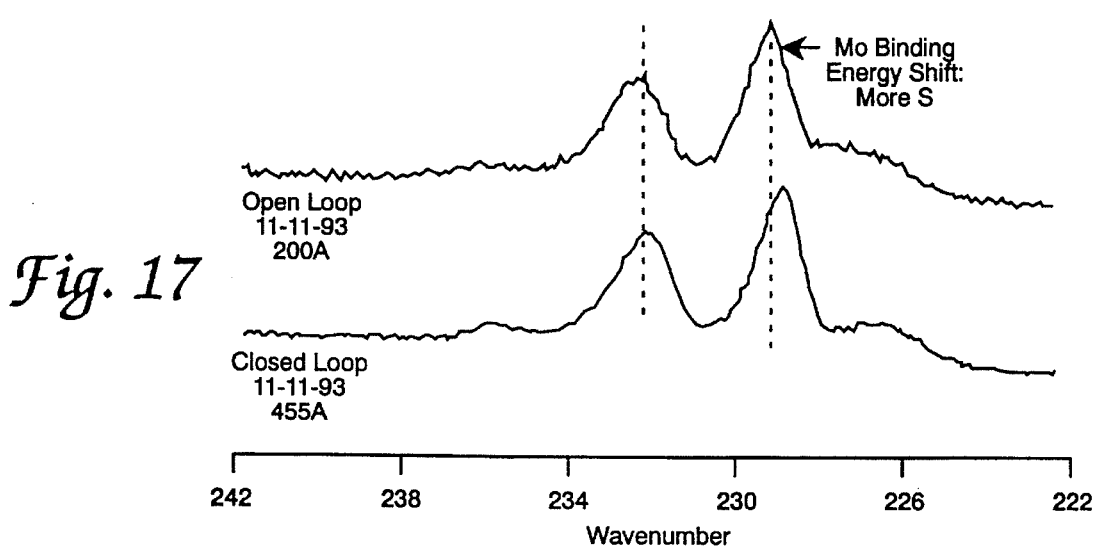
FIG. 17 is a graph showing Mo-3d XPS comparison of closed vs. open loop films.
Figure 18:
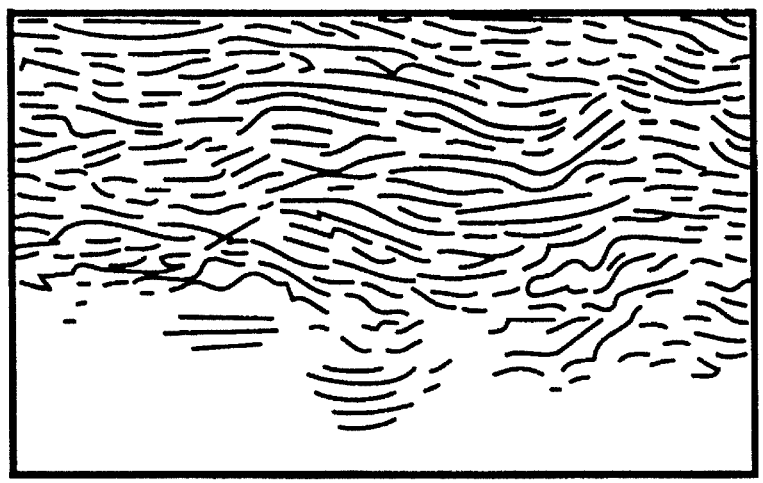
FIG. 18 is a drawing representation of a photograph showing $MoS_2$ Basal plane orientation open loop film at substrate boundary.

The results of the increased Plume constituent density and deposition rate result in the increase of $MoS_2$ in the deposited film. The results of X-ray Photon Spectroscopy (XPS) shows that there is an obvious bi-modal change in the closed loop film, indicating an increase of $MoS_2$ with use of the invention. This is shown in FIGS. 15 and 16. A shift in the Mo binding energy also shows evidence of an increase in $MoS_2$, with use of the invention.

Figure 19:
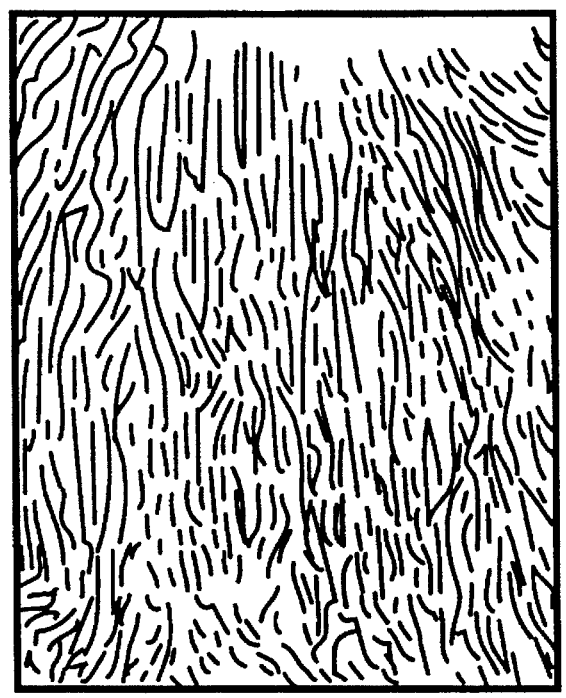
FIG. 19 is a drawing representation of a photograph showing $MoS_2$ columnar oriented open loop film at 200 Å perpendicular from substrate boundary.
Figure 20:
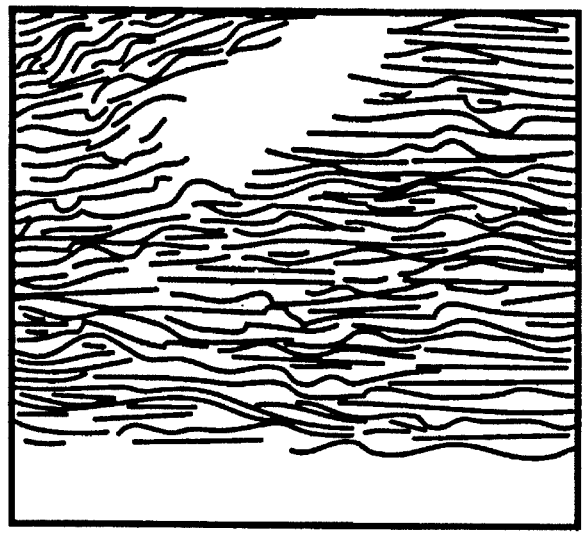
FIG. 20 is a drawing representation of a photograph showing $MoS_2$ basal plane orientation closed loop film at substrate boundary.
Figure 21:
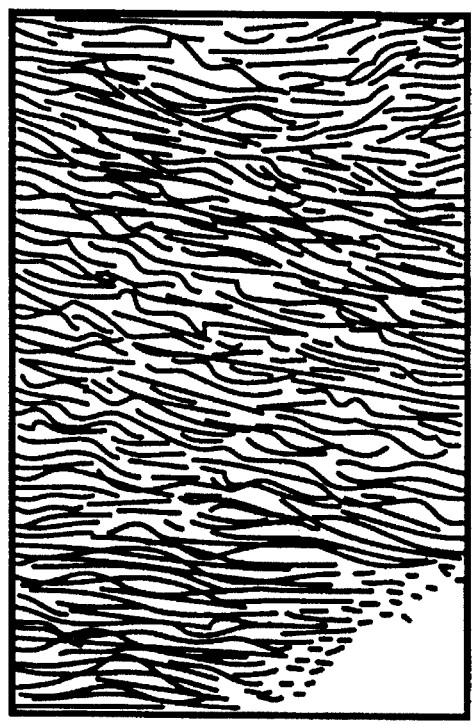
FIG. 21 is a drawing representation of a photograph showing $MoS_2$ basal plane orientated closed loop film at 400 Å perpendicular from substrate boundary.

The effects of having extra $MoS_2$ in the plume is shown in FIGS. 18, 19, 20 and 21. Transmission Electron Microscopy (TEM) micro graphs (Courtesy of Scott D. Walck, UDRI) of the resultant deposited films show that in the case of open loop films, the $MoS_2$ molecular structure is initially oriented co-planar to the basal plane, (FIG. 18) but re-orients in a columnar fashion after 100 Å of deposition. (FIG. 19)

A deposition made by the invention shows initial co-planar molecular orientation, (FIG. 20) but instead of columnar reorientation, the film maintains Co-planar orientation throughout the deposition. (FIG. 21) Thus, the use of the invention creates a unique PLD $MoS_2$ thin film, not previously possible by open loop means.

A closed loop process control test has been accomplished. The system autonomously controlled the PLD process. Deposition rate and molybdenum disulfide first ionized species were modified in real time during deposition by closed loop operation of the hierarchical algorithm.

A closed loop film generation for analysis has been accomplished. The system autonomously generated $MoS_2$ thin films with a structure never achieved previously by uncontrolled means. The simultaneous control of bulk deposition rate and Mo I ionized species modifies material crystal structure in a previously unachievable way.

An automation system to be used for superconductor research in WL/MLPO is currently being implemented. The invention has been used experimentally since the initial implementation for tribological research by the Air Force Wright Laboratory, Materials Directorate (WL/MLBT). Other possible uses include Molecular Beam Epitaxy (MBE) and Chemical Vapor Deposition (CVD) automation.

The increasing demands from both civilian and military users for more complex materials has driven the development of more sophisticated deposition process such as PLD. Unfortunately, these new processes are rife with problems. In order for PLD to become applicable as a manufacturing process, the implementation of feedback Controls, combined with new sensors help circumvent extensive research into how new process behavior affects material quality.

The benefits of PLD hierarchical feedback control has made possible the generation of materials previously not possible. The concept of sub process decomposition and uncertainty reduction was demonstrated for the first time on an actual process. By utilizing hierarchical control on a process that is poorly understood to reduce sub process uncertainty by feedback, it was possible to create materials that were previously impossible using open loop means. This has demonstrated a unique, novel material generation method.

SECTION A—THEORETICAL DESIGN AND MODELING

A.1 Applied Theoretical Discussion

A.1.1 Continuity

It is important that we know how to identify, instrument, design, and control the deposition rate and plume constituents of PLD $MoS_2$ deposition. Taylor series linearization is a well-known mathematically sound technique of linearizing a system of nonlinear equations. A system of nonlinear dynamical equations are not entirely descriptive of an actual process, though. There are additional process attributes that need to be addressed when implementing this linearization technique that may not be captured in the system of dynamical equations.

Taylor series linearization requires choice of a linearization point. The equations that are linearized must be completely controllable and completely observable at this point, in order that state feedback can occur. We desire to approximate a nonlinear, time varying real process by a linear, time invariant, finite dimensional, and smooth process model. (See B. Friedland, *Control System Design*, McGraw-Hill Publishing Company, N.Y., 1986, pp. 259–289).

Reduction of process disorder can be accomplished through process control. Unfortunately, process control based solely on mathematical models has certain inherent limitations. The difficulty in modeling the UV PLD process by a single math model based on a single first principle was covered in the first section. An alternative to a model based on process first principles is an empirical mathematical model.

Empirical models are found by actuating the process while observing process sensors. A least-squares fit to the collected data then gives the empirical math model. Statistics over a long time gives indication of the model validity. Trend analysis indicates time-varying parameters. Any math model has inherent limitations when used to describe a process. In the case of UV PLD, we desire models in the form of linear, time-invariant, finite-dimensional, ordinary differential equations that describe the way the process behaves. Since any model may fall short of describing the actual process, we must describe strategies to alleviate these inadequacies.

Figure 22:
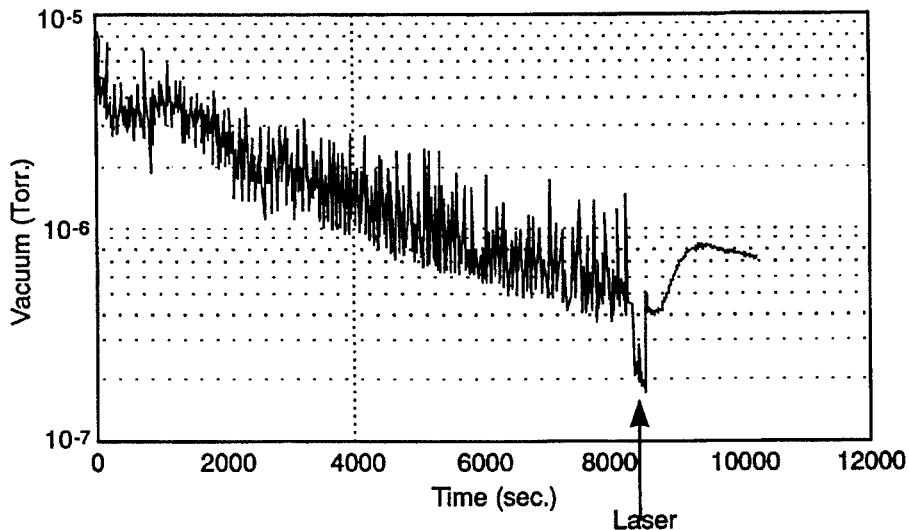
FIG. 22 is a graph showing a typical vacuum during a deposition.

There is sufficient cause to believe the PLD process behaves in a continuous fashion, if we consider the event of a laser pulse being a function of frequency and energy density. The evolution of material from the target to the substrate can be thought of as a series of material pulses that are not discontinuous. The vacuum is not zero at any time during a deposition. Thus material is always present in the chamber. There is a probability that this material will deposit on the substrate. Observation of vacuum data taken during an open loop deposition shows that this is the case. Typical data is shown in FIG. 22. Thus the material density is never instantaneously zero, even if the laser is not delivering any energy density to the PLD process target. It is meaningful to model the PLD process as continuous, even if the main laser actuator is not.

Let a model exist for a real process. Let this model be in the form of real valued time-varying first order ordinary differential equations:

$$\dot{X} = F(x, t) \in \Re$$

These first order equations describe certain attributes of the actual process. To some extent, these equations are chosen to be descriptive of the process with some goal of process behavior in mind. The process description is known to change with time.

Figure 23:
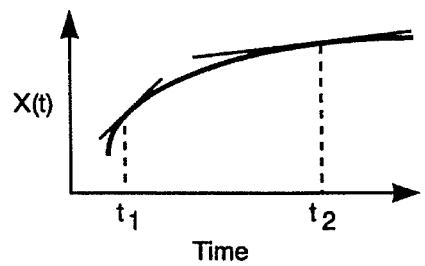
FIGS. 23, 24 and 25 are graphs showing different functions versus time.

A linear controller can be designed based on this description, but it will be inadequate in some respects. The nonlinear functions are time varying. That will require a different controller for each time that the controller is to be used. It will also present some difficulties when the controller is compensating the process, such as when transitioning design from one controller to another. If we can make some assumptions about how fast our process changes in time, and we can "reposition" the linear controller fast enough to accommodate a new linearization point, that is, deal with the transition inconsistencies, then we can approximate the process as time invariant. Let some process parameter be described as a real vector, X. Let it be said that X changes "slowly" with respect to time, as shown in FIG. 23. That is:

$$t_2 >> t_1 \forall t \in \Re$$

We can then re-design the controller "on the fly" to account for pre-determined variations in time.

A.1.2 Linearity

Figure 24:
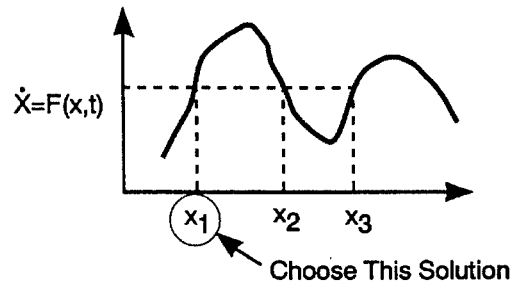

Similarly, if we know a-priori information about where to linearize the process, that is, which solution of the nonlinear equations we desire, then we can approximate the nonlinear process as linear about a small region. We have many solutions to an equation, yet we have a-priori information that tells us which solution matters to our actual process. That is, if we have $\dot{X}$, and we desire the solution x to $\dot{X} = F(x, t)$ but many possible $x_i$ exist, we have a-priori information that tells us which $x_i$ to choose. We can then pursue that chosen $x_i$ with control effort. This is shown in FIG. 24 for i=1. Choice of the particular x is based on desired material quality attributes. Knowledge about the process requires that the proper solution be determined a-priori.

A.1.3 Dimensionality

If we also have sufficient a-priori information about the process such that we can define it's behavior about where we desire to operate the process, then we can approximate the process as finite dimensional. A model of the process is usually an accurate description only for a small region. If the model is less descriptive or erroneous in other regions, yet, we attempt closed loop control in those regions, then we will obtain large control efforts and possibly instability. Thus, we only base our controller on the process model where it is a good approximation of the process.

Figure 25:
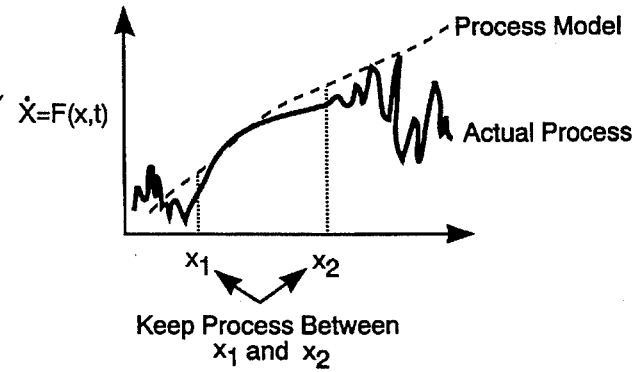

Places where the model is inadequate require another model. If no model is available, heuristical rule bases can directly actuate and sense the process. If the process changes such that no combination of actuation can maintain the process within the desired boundaries, then the operator can be notified as a last resort. (See FIG. 25—"keep process between $x_1$ and $x_2$"). Our goal of feedback is to make sure our solutions are bounded:

$$x \in [x_1, x_2]$$

If the process internal parameters are "smooth", that is, the internal parameters we desire to control have higher order derivatives that converge to zero, then our sensor designs also converge on practical "buildable" hardware.

A.2 Radial Basis Function Fit Theory

Quantum interactions govern PLD, along with thermal interactions. A controller design is often based on mathematical models. Unfortunately, no models predicting PLD behavior exist that lend themselves to control implementation. In this case, the controller can still be implemented using rules, such as fuzzy logic, models derived from numerical methods, or a combination of both. The hierarchical controller utilizes a combination of both rules that describe process behavior, and empirical models derived from numerical methods. The method used to derive empirical models is described in this section.

Continuous empirical mathematical models can be found, based on sets of data collected on a real process. Generally, for control engineers, these sets represent process inputs and outputs. Let the vectors:

$$u = \begin{bmatrix} u_1 \\ u_2 \\ \cdot \\ \cdot \\ \cdot \\ u_m \end{bmatrix} \text{ and } y = \begin{bmatrix} y_1 \\ y_2 \\ \cdot \\ \cdot \\ \cdot \\ y_n \end{bmatrix}$$

represent m-inputs and n-outputs of a process, respectively, for:

$$u \in \Re^m \text{ and } y \in \Re^n$$

and:

$$m, n \in \Im$$

These values are typically taken sequentially in time, as the process changes, such that:

$$[u, y]_{(i)}$$

represents the process, where:

$$i \in \Im$$

and all values are bounded. Functions are then approximated from these measured data sets by numerical methods.

It is desired to find a mathematical function, $f(u)$, that approximates the actual process, y, where $y^*$ is the inexact measurement of y. Such as:

$$y^* = y + \xi_{meas}$$

The goal is to find $f(u)$, such that:

$$\|y - y^*\|_p = \|y - f(u)\|_p$$

for some p'th norm. When $f(u)$ satisfies the above equation, $f(u)$ is as close to $y^*$ as possible in the p'th sense. Hence, this $f(u)$ is the best we can hope for in our modeling process.

Thus, we approximate the real process, y, by the function, $f(u)$, based on the measured corrupted outputs, $y^*$. It is beneficial to have the equality exist for at least the corrupted data. The accuracy of measurements as well as the function type affect the minimum value of each norm in the equality. Usually a norm is chosen that also "makes sense" for the measurements taken on the physical process.

There are many methods of finding the function, such as least squares function fits. In the case of PLD, the data sets are not uniformly spaced and scattered. Least squares fits are only useful for equi-spaced data. A variation on this method is radial basis function fits. Radial basis functions utilize basis functions that take advantage of the statistic properties of many data points found for the same input settings. It is important to also realize that sensor and actuator errors are included in empirical fits on the data. Thus, sensor statistical precision and accuracy nameplate data can be utilized so as not to obfuscate empirical fits with sensor bias.

As discussed previously, input and output measurements are taken over some measurement epoch. Functions of any type can be fit, but the choice is usually determined by inspection of the data. Model choice can then be made by these observations. For instance, modeling the process as a set of differential equations only makes sense when the value of y changes over time with the same value of u. It also makes sense to model the process as dynamical equations when y varies with different values of u as well as time.

In the case of dynamical modeling, intermediate dynamic values, or states, need to be chosen. For empirical models, the output mapping function, h, needs to be a 1—1 and onto function of the states. For instance, let an output function be defined as:

$$y = h(z)$$

where the dynamics, or states are modeled as:

$$z = \begin{bmatrix} z_1 \\ z_2 \\ \cdot \\ \cdot \\ \cdot \\ z_l \end{bmatrix}$$

and:

$$H: z \to y$$

$$z \in \Re$$

For empirical models, the process sensors must have complete observation of the modeled process dynamical behavior. It is also critical that sensor inaccuracies be mathematically characterized as 1 to 1 and onto (i.e., the abstract algebra meaning of the term "onto"). If actual state observation is in error, the error is also modeled. There is no way to differentiate sensor error from actual process state behavior. A sensor that is nonlinear, time-varying, or random will be reflected as state behavior. Because of this, sensor technology is critical to empirical process modeling. Actuator error also reflects on state manipulation. Actuators and sensors ultimately determine how well the states can be controlled. Process sensors must truly be "in-situ", and have known errors.

With these preliminaries in mind, in-situ empirical modeling of PLD is performed using radial basis functions. We can empirically model the PLD process as a set of nonlinear gaussian differential equations. The form:

$$\begin{bmatrix} \dot{x} \\ \dot{a} \end{bmatrix} = \begin{bmatrix} f_1(x,a,e,p) \\ f_2(x,a,e,p) \end{bmatrix}$$

is used, where:

$$z = \begin{bmatrix} x \\ a \end{bmatrix} \quad \text{and} \quad u = \begin{bmatrix} e \\ p \end{bmatrix}$$

with:

x—Non-axial substrate QCM sensed bulk thickness. [kÅ]
a—Mo I first ionized species plume density. [g/cc]
e—Incident target laser energy density. [mJ/cm$^2$]
p—Incident target laser pulse repetition rate. [Hz]and, for PLD:

$$y = z$$

The dimensionally of the functions make the model "square". The laser is capable of operating at two wavelengths, so two models of this form were found.

PLD data is then collected in the form of six-tuples. These six-tuple is the combination of linear regression data for rate calculation as well as mean value data over a fixed time interval. As discussed previously, each modeling epoch generates one data set. Each data set is given as:

$$(u,z,\dot{z})_i = ([e,p],[x_o,a_o],[\dot{x},\dot{a}])_i$$

for:

$$i \in [1,M]$$

These six-tuples include derivative information, along with initial values, for each modeling epoch. As described previously, each modeling epoch is a cluster of samples that are preprocessed to yield a six-tuple modeling data set. Each modeling epoch time interval determines each cluster of data. For instance, for the thickness rate, measurements given as:

$$+\bar{e}, \overline{dot\ x} + ee_j \in \Re$$

are determined for one epoch. Each rate measurement is made that simultaneously corresponds to four elements:

$$[x,a,e,p]_j \in \Re^{4N}$$

with:

$$j = [1,N] \in \Im$$

corresponding to the j'th instance in time. The clusters of points also have associated statistics. Similarly, simultaneous measurements for the Mc I rate are also taken as:

$$+\bar{e}, \overline{dot\ a} + ee_j \in \Re$$

Data sets consisting of several epochs result in an over determined system of equations. A best solution approximation to the over determined set is solution by least squares, which minimizes the sum of squares of all residuals. The minimum can be satisfied by solution of the so called normal equations (See D. Kincaid, W. Cheney, *Numerical Analysis*, Brooks-Cole Publishing Co., Pacific Grove, Calif., 1991, pp. 251–596.) of the least-squares problem, which are:

$$R^T R c = R^T d$$

for:

$$Rc = d$$

Finding c in this case, would be by the transformation:

$$W = [R^T R]^{-1} R^T$$

The elements of R are determined by the basis function we chose. We construct R as:

$$R = \begin{bmatrix} r_{11} & \cdots & r_{1\phi} \\ \cdot & & \cdot \\ \cdot & & \cdot \\ \cdot & & \cdot \\ r_{N1} & \cdots & r_{N\phi} \end{bmatrix}$$

for a linear sum of elements. In the case of radial basis functions, each element is:

$$r_{ij} = \exp\left\{ -\frac{|x_j - \mu_{xi}|^2}{2\sigma_{xi}^2} - \frac{|a_j - \mu_{ai}|^2}{2\sigma_{ai}^2} - \frac{|e_j - \mu_{ei}|^2}{2\sigma_{ei}^2} - \frac{|p_j - \mu_{pi}|^2}{2\sigma_{pi}^2} \right\}$$

where:

$x_j, a_j, e_j, p_j$—j'th four-tuple state and actuator measurements.

$\mu_{xi}, \mu_{ai}, \mu_{ei}, \mu_{pi}$—mean of state and actuator value clusters.

$\sigma_{xi}, \sigma_{ai}, \sigma_{ei}, \sigma_{pi}$—distribution of state and actuator value clusters.

and:

$i \in \Im$ is an arbitrary integer, chosen to represent a particular cluster number associated with the statistics. Similarly, the value:

$\phi \in \Im$ as an arbitrary integer chosen to represent the total number of clusters used to represent the data set. Then we can find a vector of weights:

$\gamma = W + \bar{e}, \overline{dot}\ \bar{x} + ee \in \Re^\phi$ so that:

$$\dot{x} = \sum_{h=1}^{\phi} \gamma_h \exp\left\{ -\frac{|x - \mu_{xh}|^2}{2\sigma_{xh}^2} - \frac{|a - \mu_{ah}|^2}{2\sigma_{ah}^2} - \frac{|e - \mu_{eh}|^2}{2\sigma_{eh}^2} - \frac{|p - \mu_{ph}|^2}{2\sigma_{ph}^2} \right\}$$

where:

x,a,e,p—four-tuple continuous process variables.

$\dot{x}$—modeled first order derivative variable.

and:

$h \in \Im$

Now, the approximation:

$\dot{x} \rightarrow +\bar{e}, \overline{dot}\ \bar{x} + ee$ is made for the given data set. This approximation is used for the thickness state dynamical model.

A similar manipulation for the Mo I state is also found. In this case, the only difference being that different weights are calculated for the four-tuples, where:

$\gamma = W + \bar{e}, \overline{dot}\ \bar{a} + ee \in \Re^\phi$ is found by multiplication, to give:

$$\dot{a} = \sum_{h=1}^{\phi} \gamma_h \exp\left\{ -\frac{|x - \mu_{xh}|^2}{2\sigma_{xh}^2} - \frac{|a - \mu_{ah}|^2}{2\sigma_{ah}^2} - \frac{|e - \mu_{eh}|^2}{2\sigma_{eh}^2} - \frac{|p - \mu_{ph}|^2}{2\sigma_{ph}^2} \right\}$$

With two continuous first order dynamical models for thickness and Mo I states, the hierarchical process controller is designed. The gaussian basis functions were chosen based on observed data, but other basis functions can be selected, based on process data. Radial basis function weights can also be updated during process runs by iterative methods to improve model accuracies during controller operation.

A.3 Taylor Series Linearization Theory

Generally, any first order nonlinear differential equation can be approximated by a linear differential equation about some particular point. One method of approximation is by vector Taylor series expansion. In this section, a description of how this is accomplished is included.

As previously stated, the radial basis function form chosen for PLD is a gaussian. This function form is nonlinear, so some method of linearization is needed in order to design a controller for the particular process bounds. In the case of the hierarchical controller, the functions must be generally linearizable, in order that the controller can be redesigned while the process executes. As before, the dynamical model is of the form:

$$\dot{z} = f(z,u) \begin{bmatrix} f_1(z,u) \\ f_2(z,u) \end{bmatrix}$$

with:

y=z and $f_1, f_2 : \Re^4 \rightarrow \Re$ $f_1, f_2 \in C^2$ $y, z, u \in \Re^2$ It is important that the functions are continuous in at least the second derivative, so that derivatives exist for the series. The gaussian chosen as the radial basis function form satisfy this criterion. Since the functions are continuous, a unique situation exists. We can expand each element of the function vector, f, by using the first order Taylor formula: (See J. A. Marsden A. J. Tromba, *Vector Calculus*, W. H. Freeman and Co., N.Y., U.S. A, 1988 pp. 243–247.)

$$f_1(z,u) = f_1(z_o, u_o) + \sum_{k=1}^{n} \Delta z_k \frac{\partial f_1}{\partial z_k}\bigg|_{(z_o, u_o)} + \sum_{k=1}^{n} \Delta u_k \frac{\partial f_1}{\partial u_k}\bigg|_{(z_o, u_o)} + R_1(\Delta z, \Delta u, z_o, u_o)$$

Where:

$$\Delta z = z - z_o = \begin{bmatrix} \Delta z_1 \\ \Delta z_2 \end{bmatrix}$$

$$\Delta u = u - u_o = \begin{bmatrix} \Delta u_1 \\ \Delta u_2 \end{bmatrix}$$

and:

$$\frac{R_1(\Delta z, \Delta u, z_o, u_o)}{\|\Delta z, \Delta u\|} \rightarrow 0 \quad \text{as } \Delta z, \Delta u \rightarrow 0 \text{ in } \Re^n.$$

We can truncate the formula to approximate a linear system about some pre-chosen point. Then we can represent the expression about some point as a system of linear equations:

$$\dot{z} \approx \begin{bmatrix} f_1(z_o, u_o) \\ f_2(z_o, u_o) \end{bmatrix} + \begin{bmatrix} a_{11}(z_o, u_o) & a_{12}(z_o, u_o) \\ a_{21}(z_o, u_o) & a_{22}(z_o, u_o) \end{bmatrix} \begin{bmatrix} \Delta z_1 \\ \Delta z_2 \end{bmatrix} +$$

-continued $$\begin{bmatrix} b_{11}(z_o,u_o) & b_{12}(z_o,u_o) \\ b_{21}(z_o,u_o) & b_{22}(z_o,u_o) \end{bmatrix} \begin{bmatrix} \Delta u_1 \\ \Delta u_2 \end{bmatrix} + R_x$$

Where:

$$R_x = \begin{bmatrix} R_1(\Delta z_1, \Delta u_1, z_o, u_o) \\ R_1(\Delta z_2, \Delta u_2, z_o, u_o) \end{bmatrix}$$

Subtracting the affine term from both sides, we have:

$$\Delta\dot{z} \approx \begin{bmatrix} a_{11}(z_o,u_o) & a_{12}(z_o,u_o) \\ a_{21}(z_o,u_o) & a_{22}(z_o,u_o) \end{bmatrix} \begin{bmatrix} \Delta z_1 \\ \Delta z_2 \end{bmatrix} +$$

$$\begin{bmatrix} b_{11}(z_o,u_o) & b_{12}(z_o,u_o) \\ b_{21}(z_o,u_o) & b_{22}(z_o,u_o) \end{bmatrix} \begin{bmatrix} \Delta u_1 \\ \Delta u_2 \end{bmatrix} + R_x$$

Where:

$$\Delta\dot{z} = \dot{z} - \dot{z}_o = \begin{bmatrix} f_1(z,u) \\ f_2(z,u) \end{bmatrix} - \begin{bmatrix} f_1(z_o,u_o) \\ f_2(z_o,u_o) \end{bmatrix}$$

We now have a general linearized system about some arbitrary point. We now can use these linear expressions to design a controller.

A.4 Lunenberger Design and Theory

Once a linearized process model exists, a method of designing a linear feedback controller is needed. A Lunenberger design is chosen, based on actuator dynamics and limitations. The method used to design the controller is covered next.

As described previously, the empirical dynamical expressions:

$$\dot{z} = f(z,u) = \begin{bmatrix} f_1(z,u) \\ f_2(z,u) \end{bmatrix}$$

with:

y=z and $f_1, f_2: \Re^4 \to \Re$ $f_1, f_2 \in C^2$ $y, z, u \in \Re^2$ have been found by radial basis functions, and linearized about some point using Taylor series expansion. The linearized functions about some point can also be shown as:

$$\Delta\dot{z} \approx A|_{(z_o,u_o)} \Delta z|_{(z_o,u_o)} + B|_{(z_o,u_o)} \Delta u|_{(z_o,u_o)}$$

Figure 26:
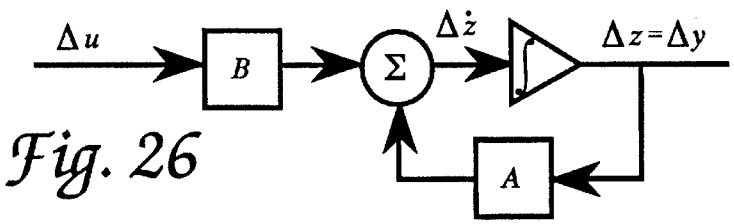
FIG. 26 is a dynamical block diagram.

For the special case of empirical functions found by the radial basis method, we must have full state observation, as mentioned previously. Given this, Taylor series expansion results in a linear dynamical system that exists about some point. We can show this in block diagram representation, shown in FIG. 26. Where all matrix elements are a function of the linearized point. Each matrix block has a vector input and output in the above diagram. As expected, the circular diagram elements sum two vectors, and the triangular block integrates the vector with respect to time.

During the early 1960's there was a flourish of interest in linear time invariant first order dynamical systems such as this. A control approach first described by David. G. Lunenberger (See D. G. Lunenberger, Introduction to Dynamical Systems, John Wiley and Sons, N.Y., 1979, pp. 296–315.) is used here. It comprises of two parts, one being the actual process, represented by a set of first order differential equations. It is important that these dynamical equations be linear, and time invariant (L.T.I.).

For PLD, the process is represented by a linear approximation to a nonlinear function from a radial basis empirical fit on a series of collected real process data. This linear representation is three times removed from the actual process input and output behavior. We must cautiously apply linear state control techniques.

The other part of the Lunenberger controller is a copy of the L.T.I. dynamical abstraction, called the "observer". This observer calculates process state behavior based on the L.T.I. first order differential equations that describe the process. The observer is usually coded in a computer. This code calculates actuator values based on sensor data in real time. It is possible to make the actual process perform in a certain desirable way by closed loop feedback. A combination of both the actual process and the observer in feedback configuration is known as observer-based compensation.

The question arises as to why we need the observer if full state feedback is available. It appears that full sensor data combined with nonlinear models makes prediction of process states unnecessary. We can simply apply feedback with the actual states. There does not seem to be a need for observer based process control.

This is a valid question, but it has an underlying assumption. It assumes we have a process that is modeled accurately and behaves predictably in every respect. The assumption is that the process states observed directly always behave as expected.

The assumption that the observed states are exact indicators of the actual subprocess states is certainly not the case of PLD. PLD process sensors sometimes indicate that the states are random in the short term, such as cones striking the thickness monitor. These short term transients need to be "filtered" out. The purpose of the observer is to provide a filtering mechanism. The observer also provides a method of imposing dynamical limitations to the laser actuator.

There is also process variation due to optical setup errors, target composition changes, among many other things. These variations appear as biases against the model, and appear from run to run, or even over several runs. The observer functions as a means of comparing process performance to predicted modeled behavior. A controller based on a model, with restricted dynamics, provides a reference point for process behavior modeling error calculations. Corrective actions can then be taken to correct the models so that they match the process.

In the case of PLD, it is imperative that strict actuator dynamical limits also be imposed. Exceeding actuator dynamical limitations can result in destruction of the thyratron high voltage switch. Thus the need for a controller is important, in that it provides a method of assuring restricted actuator dynamics.

Figure 27:
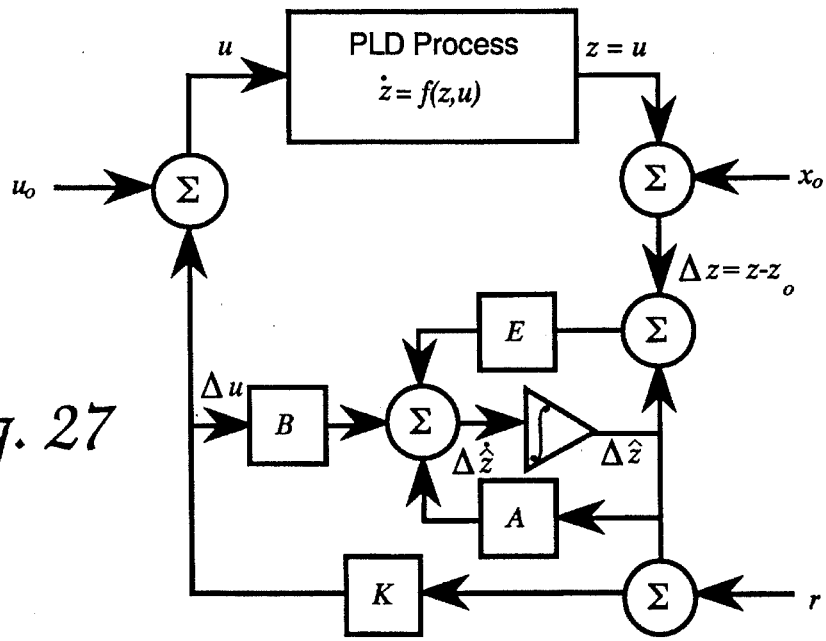
FIG. 27 is a diagram of a Lunenberger based compensator implementation.

Based on these arguments for a controller, a method of design and implementation is now described. The structure of the implemented Lunenberger observer is shown as a block diagram, with additions shown to account for the linearization point. This diagram is shown in FIG. 27.

This implemented design shown has an estimated state that is about some linearized point. The linearized point must be determined somehow, and made to match the actual process nonlinear state. This difference between actual and observer states is the error signal that drives the estimated observer state. The observer gain is chosen by the matrix E. The estimated state is used to calculate actuator values by feedback gain matrix K. These values are then used to calculate actuator efforts. The combined dynamics of the observer are calculated by:

$$\dot{\hat{z}} = (A+BK-E)\hat{z} + BK(z_o - r) + E(z-z_o)$$

and the process input is calculated as:

$$u = BK(z_o - r)$$

Our desired state behavior of the closed loop process is the vector r. The outer loop feedback gain provides the ability to "steer" the process. A choice of K allows us to choose the process dynamics to become some arbitrary vector r. Then we choose E so that the compensator modes are faster than the process modes. That is:

$$\|E\|_p > \|A\|_p > \|K\|_p$$

for some p'th norm. A method of gain selection based on eigenvalues is often called pole placement. This is the method that is used here.

An algorithmic method of finding the observer gain and feedback gain matrices is needed, because this will be necessary at every new selected linearization point. Solution of these gain matrices is arbitrary with the Lunenberger observer compensator.

Initially, we linearize the process and start by solution of the process dynamics in terms of eigenvalues. These are found by quadratic equation solution for a two by two system such as that used here, or by the Hessenberg method for higher order systems.

In either case, the characteristic polynomial of the linearized A matrix is found by:

$$\det[\lambda I - A|_{(z_o, u_o)}] = p[\lambda|_{(z_o, u_o)}]$$

Where the polynomial is a function of the point of linearization. The roots of the characteristic polynomial are the eigenvalues of A, and are:

$$\text{roots}\{p[\lambda|_{(z_o, u_o)}]\} = \{\lambda_1|_{(z_o, u_o)}, \lambda_2|_{(z_o, u_o)}\}$$

for some linearization point. These eigenvalues describe the process dynamics of the linearized model. The eigenvalues can be complex and generally are positive for the unstable PLD process. If the eigenvalues are complex, then the value:

$$-|Re\{\lambda|_{(z_o, u_o)}, \lambda^*|_{(z_o, u_o)}\}| = \lambda_d|_{(z_o, u_o)}$$

is our design value. If the eigenvalues are real, then the value:

$$-|\min\{\lambda_1|_{(z_o, u_o)}, \lambda_2|_{(z_o, u_o)}\}| = \lambda_d|_{(z_o, u_o)}$$

is our design value. If the eigenvalues repeat, then a new linearization point must be chosen.

Suppose we desire the process to be stable, with some desired eigenvalue:

$$\lambda_a \in \Re$$

This eigenvalue is where we would like the process dynamics to be, regardless of linearization point. We shall call it the eigen-attractor, or translated to one language, the proper-attractor, or eigenanzehen in German. A simple method of calculating the approximate closed loop dynamics is to take the difference:

$$k_1[\lambda_a - \lambda_d|_{(z_o, u_o)}] = \lambda_{CL}|_{(z_o, u_o)}$$

Where the constant:

$$k_1 \in [0,1]$$

And where the constant defines an error bound on the closed loop process eigenvalue. Typically this bound is based on expected actuator error, with 0.9 being typical.

In the specific case of PLD, one state is required to be more dynamic than another. The desired closed loop eigenvalues can then be:

$$\begin{bmatrix} k_2 \lambda_{CL}|_{(z_o, u_o)} & 0 \\ 0 & \lambda_{CL}|_{(z_o, u_o)} \end{bmatrix} = \Lambda_{CL}|_{(z_o, u_o)}$$

Where the constant:

$$k_2 > 1.0 \in \Re$$

With typical values being 1.001 for the PLD process.

The observer gain is usually greater than the closed loop process gain. In this case, because the desired matrix was chosen to be diagonal, the closed loop matrix was scaled:

$$\begin{bmatrix} k_2 k_3 \lambda_{CL}|_{(z_o, u_o)} & 0 \\ 0 & k_3 \lambda_{CL}|_{(z_o, u_o)} \end{bmatrix} = \Lambda_{OBS}|_{(z_o, u_o)}$$

Where:

$$k_3 > 1.0 \in \Re$$

From these desired dynamics, we need to calculate K and E. Direct algebraic manipulations allow us to solve for K and E. We have:

$$B^{-1}(A_{CL} - A) = K$$

and:

$$(A - A_{OBS})C^{-1} = E$$

Where C=I, and B must be invertible, and the linearized point notation is dropped for brevity.

When we linearize the plant at some point, we have new A and B matrices. We must first check to see if B is invertible. A method of checking B's inveritibility is to find the condition of B by singular values. Singular values are computed by the singular value decomposition, covered in appendix A. The condition of B is found first:

$$\text{Cond}(B) = \frac{\max(\sigma_i(B))}{\min(\sigma_i(B))}$$

for:

$$i = \dim(B)$$

In this case, i=2, where B has the following singular values:

$$\text{svd}(B) = \{\sigma_1, \sigma_2\}$$

The condition of B is checked against an arbitrary threshold. In this case, 0.0001 was used. Additionally, a test for diagonality was added. This is because the singular value decomposition is not a reliable test for diagonal matrices.

The method originally tried was the controllability Grammian. The controllability Grammian is found as:

$$Q_c = [B \; AB \; A^2B \ldots A^{n-1}B]$$

We then find all vectors, w, such that:

$$w^T Q_c = 0$$

The number of w vectors should be equal to the dimension of A. This method was not used due to the desired algorithmic nature of the problem, combined with the Increased complexity. That is, it was desired that B not be "nearly singular". Vectors, w, can be found that are arbitrarily small that make this method unreliable.

Next, the design requires solution of A's eigenvalues. As mentioned before, the eigenvalues are found by the well known Hessenburg method. (See B. T. Smith, et. al. Matrix Eigensystem Routines—EISPAK Guide, 2nd ed., Lecture notes in Computer Science, vol. 6, Springer-Verlag, N.Y., 1976.). Although simple quadratic solution can also be used in the case of dimension of two, future expansion to more dimensions was desired, so more general algorithms were used in this implementation. The eigenvalues of the matrix A are used to design the controller dynamics, as well as transformation matrices.

Once the eigenvalues are found, eigenvectors are needed to transform our designed matrices to the same basis of A. The eigenvector choice will affect the norms of K and E. It is important that the magnitudes of K and E not become too large.

Figure 28:
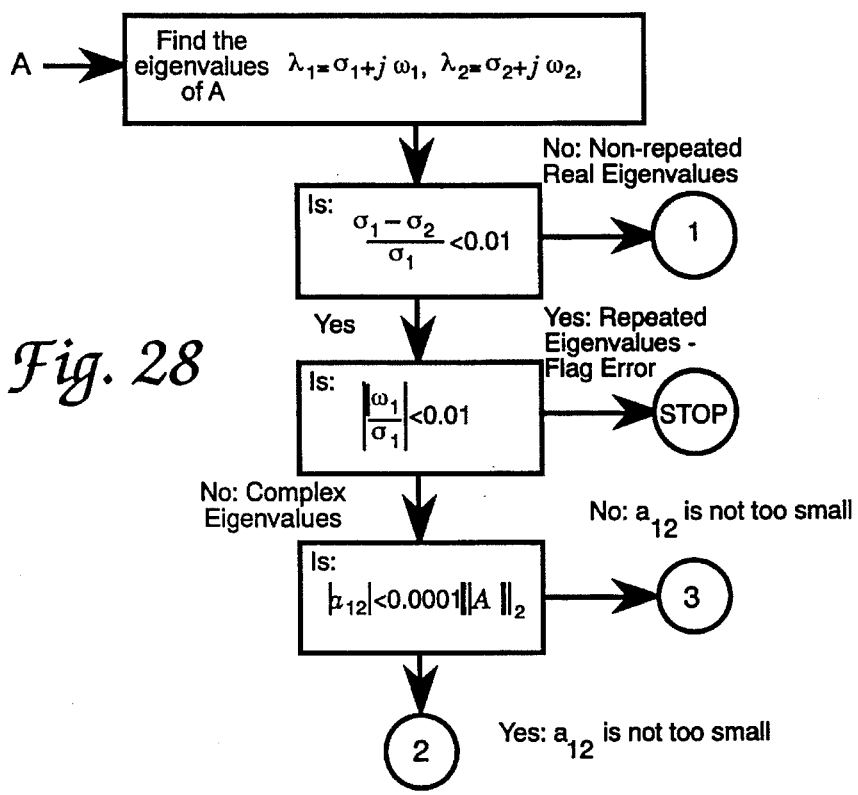
FIGS. 28 and 29 are an Eigenvector transformation vector flowchart.
Figure 29:
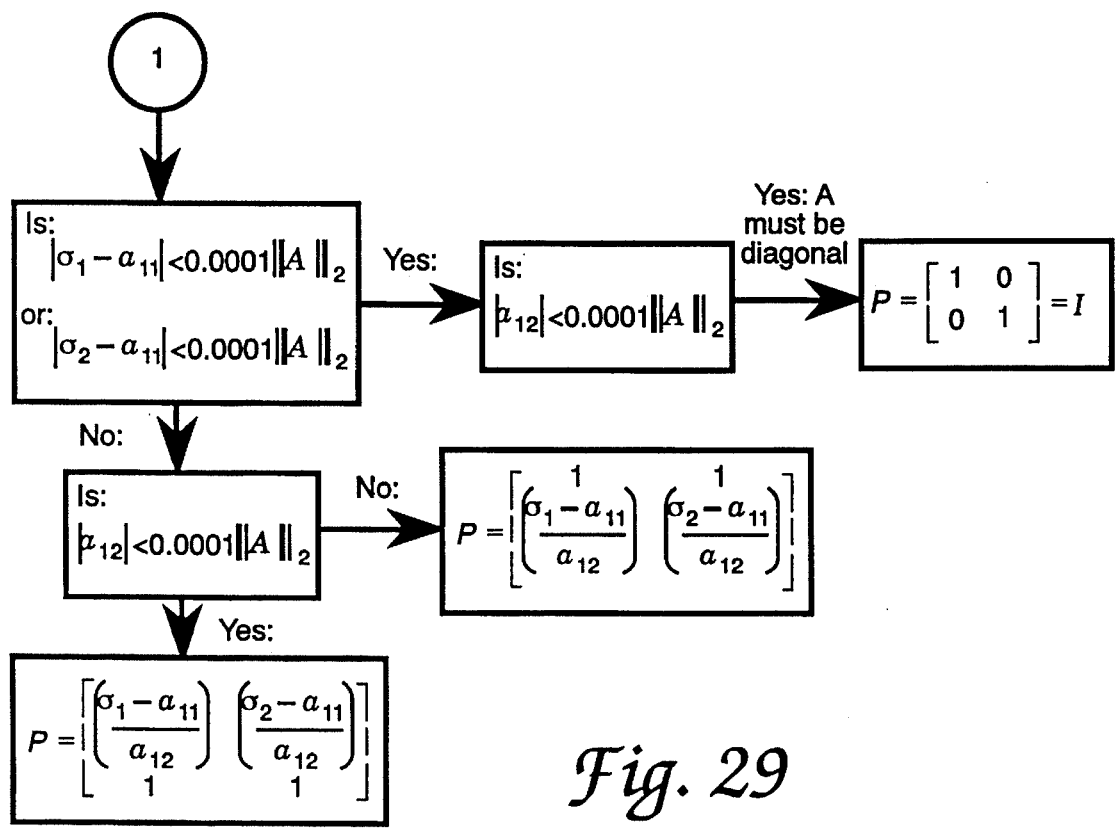

The method used to calculate the transformation matrix, P, is shown in FIG. 28, in the specific case of where A has dimension of two. As with B being invertible, errors are handled by relinearization about a new point. Each direction of the flowchart has a different transformation matrix result, based on the eigenvalues of A, as well as the elemental values of A. Elemental values of A can cause division by zero. If the eigenvalues are both distinct, real valued, as in choice 1 on the flowchart, the transformation matrix is found by the following flowchart shown in FIG. 29.

In the case of complex conjugate eigenvalues, there is two more choices; based on A's element sizes. As before, the choices are made to prevent division by zero. If $a_{12}$ is large, as in choice 3, then we build a transformation matrix of real Jordan form, covered at the end of this section. We choose to make:

$$P = \begin{bmatrix} 1 & 0 \\ \alpha & \beta \end{bmatrix}$$

Where:

$$\alpha = \frac{\sigma_1 - a_{11}}{a_{12}}, \quad \beta = \frac{|\omega_1|}{a_{12}}$$

If $a_{12}$ is not large, as in choice 2, then we build the transformation matrix:

$$P = \begin{bmatrix} \alpha & \beta \\ 1 & 0 \end{bmatrix}$$

Where:

$$\alpha = (\sigma_1 - a_{11}) \left[ \frac{a_{12}}{(\omega_1)^2 + (\sigma_1 - a_{11})^2} \right]$$

and:

$$\beta = |\omega_1| \left[ \frac{a_{12}}{(\omega_1)^2 + (\sigma_1 - a_{11})^2} \right]$$

We then have a change of basis matrix, P, based on the eigenvalues of A.

This transformation matrix lets us take our designed diagonal matrices and change their basis to the same one as A. In this manner, we preserve A's basis for calculation of K and E. Since:

$$P^{-1}AP = \Lambda_A$$

Then it is also true that:

$$A = P\Lambda_A P^{-1}$$

We can use P to convert our desired designed matrices to A's basis:

$$A_{CL} = P\Lambda_{CL} P^{-1}$$

and:

$$A_{OBS} = P\Lambda_{OBS} P^{-1}$$

We can now solve for g and E, using these transformed matrices by:

$$B^{-1}(P\Lambda_{CL}P^{-1} - A) = K$$

and:

$$(A - P\Lambda_{OBS}P^{-1})C^{-1} = E$$

Where K and E are both functions of the linearized point $(z_o, u_o)$. There are other ways to calculate change of basis functions. The method described herein was chosen to preserve the basis of A, while providing the flexibility of designing the observer based on A's eigenvalues, and their difference from the eigenanzehen. Ultimately, in the case of PLD, failure of the algorithm can be handled by relinearization about a new point after some time has passed.

PLD has the benefit of being a slow moving process, that is uncontrollable over the entire process cycle, but controllable over small regions where the thin film is created. It is important that the controller be able to attempt actuation of the process about some linearized space before the process migrates and becomes uncontrollable. This is not sufficient, though. When the process has moved sufficiently beyond this linearized subspace and becomes uncontrollable, the controller must be capable of redesign about a new linear space that fits the process state migration. In this manner, the controller can attempt to actuate the process about some finite linear space, and if the process migrates beyond this space, the controller does not become useless, but changes to accommodate this new process subspace.

The choice of new linearized points is based on a rulebase. This rulebase contains apriori process information about process, controller, and state behavior in a qualitative form. Linearization point choices are then made from this.

REAL JORDAN FORM

If $$Q^{-1}AQ = \Lambda_A$$

Then it is also true that:

$$A = Q\Lambda_A Q^{-1}$$

We desired that $\Lambda$ be real valued, even if the eigenvalues of A are not. Let the basis vectors be of the form:

$$e_r = \sum_{i=1}^{n} \alpha_i \tilde{e}_i$$

where:

$$\tilde{e}_i \in \Lambda, \quad e_r \in A$$

and in the case of this PLD description, n=2. Let the eigenvalues of A be a complex conjugate pair:

$$\{\lambda|_{(z_0,u_0)}, \lambda^*|_{(z_0,u_0)}\} = \sigma|_{(z_0,u_0)} \pm j\omega|_{(z_0,u_0)}$$

and so the diagonalized matrix of A will be:

$$\begin{bmatrix} \sigma|_{(z_0,u_0)} + j\omega|_{(z_0,u_0)} & 0 \\ 0 & \sigma|_{(z_0,u_0)} - j\omega|_{(z_0,u_0)} \end{bmatrix} = \Lambda_A|_{(z_0,u_0)}$$

but we would like to find the transformation matrix that makes the matrix nearly diagonal, that is, diagonal if A has real eigenvalues, and block diagonal if A has complex eigenvalues. A matrix that does this is:

$$Q = \begin{bmatrix} 1 & 1 \\ j & -j \end{bmatrix}$$

and the inverse of this transformation matrix is:

$$Q^{-1} = \begin{bmatrix} \frac{1}{2} & \frac{-j}{2} \\ \frac{1}{2} & \frac{j}{2} \end{bmatrix}$$

Now, we have:

$$Q\Lambda_A|_{(z_0,u_0)}Q^{-1} =$$

$$\begin{bmatrix} 1 & 1 \\ j & -j \end{bmatrix} \begin{bmatrix} \sigma|_{(z_0,u_0)} + j\omega|_{(z_0,u_0)} & 0 \\ 0 & \sigma|_{(z_0,u_0)} - j\omega|_{(z_0,u_0)} \end{bmatrix} \begin{bmatrix} \frac{1}{2} & \frac{-j}{2} \\ \frac{1}{2} & \frac{j}{2} \end{bmatrix} =$$

$$\begin{bmatrix} \sigma & \omega \\ -\omega & \sigma \end{bmatrix}$$

which is the real Jordan form. P is constructed based on these manipulations.

A.5 Rulebase and Consensus Filter

The previous sections discussed the design of a linear controller from a nonlinear dynamical representation about some arbitrary point. Choices for the controller dynamics by pole placement methods were generalized so that the pole placement would be somewhat independent of the linearization point. A method to choose the linearization point is now needed.

The use of rulebases for direct control of a process is not new. (See S. R. LeClair, F. L. Abrams, "Qualiative Process Automation", International Journal of Computer Integrated Manufacturing, vol. 2, no. 4, (1989), pp. 205–211). (QPA) These rulebases usually directly observe the process behavior, and make changes in actuation values. Generally, the process is not modeled, only general derivative information is known about the process. In the case where process derivatives can be measured, more effective control can be introduced by a hierarchy of control. A hierarchy may consist of three layers. These three levels have many monikers with the different process incarnations. Some of these names are listed below:

Upper Level:
process manager level
material domain level
supervisor level
inference level
knowledge level
Middle Level:
coordination in situ controller
in situ subprocess description level
coordination level
parser level
Low Level:
environmental controller
control level
execution level Typically, the low level controller is a linear design based on well known control theories. The low level controller design is derived from linear, time invariant, finite-dimensional (LTIFD) process descriptions. The low level controller lends itself to mathematical analysis. Concepts such as robustness, stability margins, optimality, and modeled uncertainty can be incorporated in the low level. The hierarchical low level handles the process from instant to instant. The low level is sometimes a means of achieving only setpoints on the process or a filtering mechanism of the process.

Hierarchical low level controller design is usually PID or observer based. The low level is involved in a change of basis on the process from hardware to software. Hierarchical low levels generally attach to the real process by sensors and actuators, and contain some error filtering mechanism.

The hierarchical upper level contains information about how the process behaves in the large. Hierarchical upper levels may contain a description of the material properties as well as the process behavior. Inferences are usually contained in the upper level of the hierarchy. Information about the process is usually qualitative, or event driven. A combination of events and schedules may be used to direct the process. Because of the discrete, qualitative nature of the information contained in the upper level, finite dimensional algebraic mathematical description and analysis is seldom used to augment design.

Hierarchial upper levels usually manifest themselves as computer codes executed on Von-Neuman architecture computers. Qualitative inference thresholds may be based on statistical analysis, or apriori observation and measurement.

Middle levels of the hierarchy are usually a means of connecting the upper level inferences to the low level LTIFD controller. The middle level is usually responsible for coordination among the upper level events, setpoint changes, inferences, and others to the low level LTIFD model and setpoints. This may be manifest as a predetermined interconnection. Some hierarchies utilize a redesigning method for the middle level. Others decide how to translate upper level decisions to low level settings. The middle level underlying motive is to manifest upper level decisions from the upper level to process changes by the lower level.

Hierarchical middle levels may be manifest as computer codes, electrical interconnections of computers, or combinations. Some form of distributed processing may be used where several computers implement the different levels.

Previous discussions of the Lunenberger observer based compensation and Lunenberger design based on Taylor series linearization have alluded to a hierarchical design. As previously mentioned, process models of the form:

$$\dot{z} = f(z, u)$$

with:

$$y = z$$

can be found using radial basis methods. Taylor series linearization of this function combined with pole placement generate a Lunenberger observer based compensator. We can then control the process using this designed controller. Performance of a particular controller on the actual process will be determined by Taylor series linearization point choice combined with model/process agreement.

Figure 30:
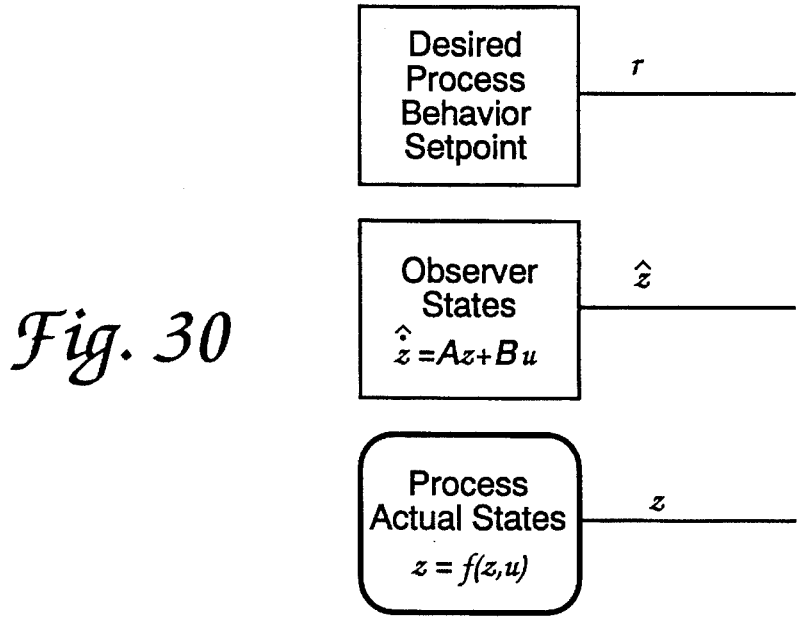
FIG. 30 is diagram showing process metric choice.

As previously shown, Taylor series linearization for the Lunenberger design is about a mathematically arbitrary point. We can then choose a linearization point by qualitative means based on the controller's interaction with the process at any time. At this point we can define metrics that determine the performance of the controller and process. Since the process states are directly observable in this case, metrics that compare the observer states with the process states can be defined. At any instance, the process state is being manipulated by the controller, based on it's own estimated state, to achieve a desired setpoint value. Metrics that involve these three values measure the controller's agreement with the process. The three values are shown in FIG. 30.

Figure 31:
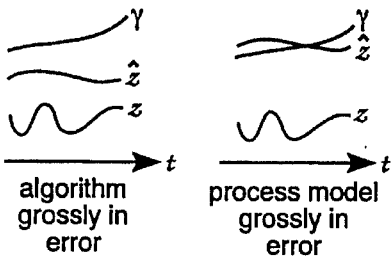
FIG. 31 is a chart of process qualitative events.

Observation of these values over time indicate the controller/process performance. Actions can be taken based on these metrics to change the linearization point and design a new controller. If no suitable design can be made the alternative is to shut the process down. FIG. 31 shows some possible metric behavior scenarios. These metrics, combined with controller actuation efforts can be used to build a rulebase. This rulebase forms the hierarchical third level, supervising design and linearization of the controller.

The two-norm three-tuple can be calculated with each iteration of the Lunenberger observer algorithm. The two norm is chosen arbitrarily. The three-tuple is:

$$(\|z-r\|_2, \|\hat{z}-r\|_2, \|z-\hat{z}\|_2)$$

This three-tuple can be compared to the threshold three-tuple:

$$(th_1, th_2, th_3)$$

and appropriate actions can be taken. These actions are based on the thresholds being exceeded. The action of shutting down the process should occur when either the event:

$$(\|z-r\|_2 > th_1, \|\hat{z}-r\|_2 > th_2, \|z-\hat{z}\|_2 > th_3)$$

or:

$$(\|z-r\|_2 > th_1, \|\hat{z}-r\|_2 < th_2, \|z-\hat{z}\|_2 > th_3)$$

occur with regularity during closed loop control of the process. These events would occur when either the process model or perhaps the entire algorithm is grossly in error as to describing and controlling process behavior. By examination of these metrics, control is impossible with the existing sensors and algorithm. These events would occur only after several redesigns of the controller have failed.

Redesigning the controller entails choice of a new linearization point. Events that indicate that this may be a problem with the controller and process are:

$$(\|z-r\|_2 < th_1, \|\hat{z}-r\|_2 > th_2, \|z-\hat{z}\|_2 > th_3)$$

This event indicates either poor observer or feedback gain. It can be inferred that the process has migrated from the previous linearization point, and another needs to be chosen. Another event is:

$$(\|z-r\|_2 > th_1, \|\hat{z}-r\|_2 > th_2, \|z-\hat{z}\|_2 < th_3)$$

This event indicates that the observer derivative term is grossly in error. Again, this event would occur if the process had migrated sufficiently from the linearization point.
The event:

$$(\|z-r\|_2 < th_1, \|\hat{z}-r\|_2 < th_2, \|z-\hat{z}\|_2 < th_3)$$

would occur with regularity given a valid linearization point. This event can also be described as good setpoint tracking, given reasonably small thresholds, and is a common goal of closed loop control.

Actuator effort is rarely a limitless commodity. The events:

$$u > u_{max} \text{ or } u < u_{min}$$

occurring with regularity indicate the controller is exceeding the actuator bounds defined by the two-tuple:

$$(u_{min}, u_{max})$$

As the process migrates from the linearization point, the actuator effort increases. Relinearization about a new point reduces actuator effort.

These events may occur on occasion, even with a good controller linearization point. It is not necessary that the controller be redesigned for each event occurrence. It is important to realize that a regular occurrence of the events indicate that the controller is not successfully manipulating the process. A method must be incorporated into the hierarchical upper level to minimize unnecessary controller redesign. The term "regular" needs clarification.

Let a regular occurrence be defined as an event occurring k times in a row. We can call this a temporal event consensus. The consensus of several events occurring in sequential time will be our indication for a controller redesign action, be it either relinearization or system shut down. In this way, if a single event occurs; there will be no redesign. On the other hand, multiple events occurring in succession constitute hierarchical upper level corrective action. The consensus number is reset for each false occurrence of an event.

Figure 32:
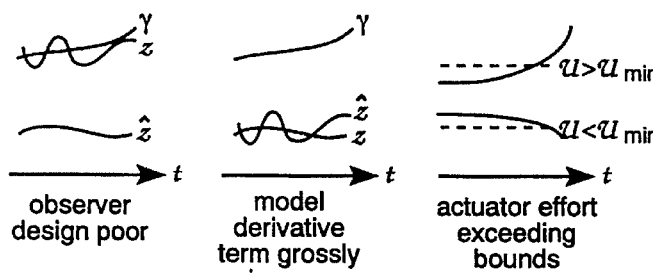
FIG. 32 comprises equations showing a temporal event consensus graphic.

As an example, this is shown next for the event:

$$(\|z-r\|_2 > th_1, \|\hat{z}-r\|_2 > th_2, \|z-\hat{z}\|_2 < th_3)$$

by the graphic in FIG. 32.
where:

$k_c$—consensus number.
and—is the logical "and".

and the other quantities are as defined previously. If one event is false before the consensus number is reached, the count starts over. This type of empirical filter can be mathematically modeled as a binary autocorrelator.

Actions taken by the rulebase are either a new linearization point choice or process shutdown. For PLD, the linearization points can be chosen as:

$$(z, u)_o = (z, u)$$

where:

$(z, u)_o$—is the point about where Taylor series linearization is found and, subsequent Lunenberger controller is designed.

$(z, u)$—is the current process state and actuator values at the time of relinearization.

In the case where the event:

$$u > u_{max} \text{ or } u < u_{min}$$

we make:

$$(z, u)_o = (z, 0.9 u_{max}) \text{ or } (z, u)_o = (z, 1.1 u_{min})$$

which forces the linearization inside the actuator bounds.

Each linear controller design also requires a setpoint. Since we have derivative information as approximated by the nonlinear dynamical model being evaluated at the relinearization point, we have four choices for setpoints, given the actuators and states as defined previously. Since derivative information is available by solution of the dynamical equations at each linearization point, four possible setpoint choices are available. These are shown in the following table.

| Setpoint Choice | Effect |
| --- | --- |
| $(rx = x_0 + Tx_0, ra = a_0)$ | Model conformity |
| $(rx = x_0 + Tc_1, ra = a_0)$ | Thickness rate conformity. |
| $(rx = x_0 + Tx_0, ra = c_2)$ | Mo I density conformity. |
| $(rx = x_0 + Tc_1, ra = c_2)$ | Arbitrary conformity. |

Arbitrary conformity requires multidimensional process direction. If this is not achievable for a given linearization point, controller error increases and is detected by process controller metrics, resulting in relinearization. PLD setpoint choice requiring the highest actuation effort utilizes arbitrary conformity. Typically, this also is the desired setpoint choice that would most drastically determine material change.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. A hierarchical control system for a Pulsed Laser Deposition (PLD) growth process in which a target of a given material and a substrate are located within a vacuum chamber, and a laser transmits a laser beam, beam control means for controlling the direction of the laser beam to scan the target to produce a plasma which coats the substrate, wherein there are sensors for the vacuum chamber, with data acquisition means coupled to at least one of the sensors;

a process control computer coupled via a bus to the laser, the beam control means, the data acquisition means, and at least some of the sensors;

wherein said hierarchical control system comprises a multifeatured control system for the growth process, utilizing said sensors for sub process control, combined with a dynamical feedback control PLD process, having first, second and third levels of feedback control;

wherein the first level of feedback control includes means to improve the precision and tracking of sub process variables by linear observer based compensator control, wherein a plume species density per laser pulse and bulk substrate thickness from the sensors provide real time sub process data to an observer; and an observer based compensator means then directly calculates laser energy density per pulse and pulse repetition rate based on current values predicted by the linear model;

wherein the second level of feedback control provides the observer with a linear controller design, the second level of feedback control comprising a dynamical system design means and nonlinear process map, nonlinear mapping being used to design a new observer based compensator for each linearization point chosen by the third level of feedback control, wherein the second level of feedback control relies on a nonlinear first order multidimensional differential mapping of the process, this nonlinear dynamical model of the process being updated using automatic process identification experiments;

wherein the third level of feedback control comprises an expert system rulebase and command input means to achieve a desired product goal, the rulebase being general enough to be the basis of an expert system that deals with the interaction of any controller and process, wherein an expert controller decides whether or not the process linearized model used by the first level of feedback control is accurate enough to achieve the desired process goals, and based on controller-process performance, a controller re-design is commanded by the third level of feedback control to the second level of feedback control, and then implemented by the first level of feedback control.

2. A hierarchical control system for a Pulsed Laser Deposition (PLD) thin-film tribological growth process in which a target of $MoS_2$ material and a substrate are located within a vacuum chamber, and a laser transmits a ultra violet laser beam via a mirror gimbal, mirror control means for controlling the mirror gimbal to give a raster on the target to produce a plasma which coats the substrate, wherein there are sensors for the vacuum chamber including a vacuum gage, a thickness monitor having a quartz crystal micro balance, a mass spectrometer, and a spectroscopy sensor, with data acquisition means coupled to the spectroscopy sensor;

a process control computer coupled via a bus to the laser, the mirror control means, the data acquisition means, the vacuum gage, the thickness monitor, and the mass spectrometer;

wherein said hierarchical control system comprises a multifeatured control system for the thin-film tribological growth process, utilizing said sensors for sub process control, combined with a dynamical feedback control PLD process, having first, second and third levels of feedback control;

wherein the first level of feedback control includes means to improve the precision and tracking of sub process variables by linear observer based compensator control, wherein a Mo I plume species density per laser pulse and bulk substrate thickness by the quartz crystal micro balance provide real time sub process data to an observer; and an observer based compensator means then directly calculates laser energy density per pulse and pulse repetition rate based on current values predicted by the linear model;

wherein the second level of feedback control provides the observer with a linear controller design, the second level of feedback control comprising a dynamical system design means and nonlinear process map, nonlinear mapping being used to design a new observer based compensator for each linearization point chosen by the third level of feedback control, wherein the second level of feedback control relies on a nonlinear first order multidimensional differential mapping of the process, this nonlinear dynamical model of the process being updated using automatic process identification experiments, wherein although the observer design is based on a linear model that is dependent on each particular linearization point, a unique pole placement method used is not dependent on linearization point, so that the closed loop combination of controller and process attempt to achieve the selected dynamics, irrespective of linearization point;

wherein the third level of feedback control comprises an expert system rulebase and command input means to achieve a desired product goal, the rulebase being general enough to be the basis of an expert system that deals with the interaction of any controller and process, wherein an expert controller decides whether or not the process linearized model used by the first level of feedback control is accurate enough to achieve the desired process goals, and based on controller-process performance, a controller re-design is commanded by the third level of feedback control to the second level of feedback control, and then implemented by the first level of feedback control.

* * * * *